(12) United States Patent
Yamazaki

(10) Patent No.: US 7,804,351 B2
(45) Date of Patent: Sep. 28, 2010

(54) MIXER CIRCUIT FOR FREQUENCY MIXING OF DIFFERENTIAL SIGNALS

(75) Inventor: Daisuke Yamazaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/335,570

(22) Filed: Dec. 16, 2008

(65) Prior Publication Data

US 2009/0243700 A1    Oct. 1, 2009

(30) Foreign Application Priority Data

Mar. 28, 2008    (JP) .............................. 2008-086898

(51) Int. Cl.
*G06G 7/14*    (2006.01)
(52) U.S. Cl. .................. 327/361; 327/355; 455/323
(58) Field of Classification Search ......... 327/355–361; 455/323, 336, 326, 333
See application file for complete search history.

(56) References Cited

U.S. PATENT DOCUMENTS 6,871,057 B2* 3/2005 Ugajin et al. ............... 455/323
7,457,606 B2* 11/2008 Kim ........................... 455/323
7,589,579 B2* 9/2009 Sanduleanu et al. ......... 327/359

FOREIGN PATENT DOCUMENTS

| JP | 10-275193 | 10/1998 |
| JP | 2003-234619 | 8/2003 |

* cited by examiner

*Primary Examiner*—Dinh T. Le
(74) *Attorney, Agent, or Firm*—Fujitsu Patent Center

(57) ABSTRACT

A mixer circuit designed for low voltage operation with rail-to-rail local signals. First and second transistors form a first input section to produce a first signal. Third and fourth transistors form a second input section to produce a second signal. Fifth and sixth transistors form a third input section to produce a third signal. Seventh and eighth transistors form a fourth input section to produce a fourth signal. A differential RF input signal drives the first, third, fifth, and seventh transistors, while a differential local signal drives the second, fourth, sixth, and eighth transistors. Ninth and tenth transistors form a positive output section to produce a non-inverted output signal. Eleventh and twelfth transistors form a negative output section to produce an inverted output signal. The ninth to twelfth transistors are driven by the first to fourth signals, respectively.

13 Claims, 32 Drawing Sheets

FIG. 4

| PATH P1 | RFin(+) ⟶ M1 ⟶ Mid1 ⟶ M9 ⟶ IFout(+) |
|---|---|
| PATH P2 | RFin(-) ⟶ M7 ⟶ Mid4 ⟶ M12 ⟶ IFout(-) |
| PATH P3 | RFin(-) ⟶ M3 ⟶ Mid2 ⟶ M10 ⟶ IFout(+) |
| PATH P4 | RFin(+) ⟶ M5 ⟶ Mid3 ⟶ M11 ⟶ IFout(-) |

FIG. 5

| LO STATE | | TRANSISTOR STATE | SELECTED PATH |
|---|---|---|---|
| POSITIVE LOGIC STATE | LO(−)=Low | { M1=ON[RFin(+)], M2=OFF } | RFin(+) →PATH P1→ IFout(+)   L1 |
| | LO(+)=High | { M5=OFF, M6=ON } | |
| | LO(−)=Low | { M7=ON[RFin(−)], M8=OFF } | RFin(−) →PATH P2→ IFout(−)   L2 |
| | LO(+)=High | { M3=OFF, M4=ON } | |
| NEGATIVE LOGIC STATE | LO(−)=High | { M7=OFF, M8=ON } | RFin(−) →PATH P3→ IFout(+)   L3 |
| | LO(+)=Low | { M3=ON[RFin(−)], M4=OFF } | |
| | LO(−)=High | { M1=OFF, M2=ON } | RFin(+) →PATH P4→ IFout(−)   L4 |
| | LO(+)=Low | { M5=ON[RFin(+)], M6=OFF } | |

FIG. 22

| PATH P1 | RFin(+) ⟶ m1 ⟶ mid1 ⟶ m6 ⟶ IFout(+) |
|---|---|
| PATH P2 | RFin(-) ⟶ m4 ⟶ mid4 ⟶ m12 ⟶ IFout(-) |
| PATH P3 | RFin(-) ⟶ m2 ⟶ mid2 ⟶ m8 ⟶ IFout(+) |
| PATH P4 | RFin(+) ⟶ m3 ⟶ mid3 ⟶ m10 ⟶ IFout(-) |

FIG. 23

| LO STATE | | TRANSISTOR STATE | SELECTED PATH |
|---|---|---|---|
| POSITIVE LOGIC STATE | LO(-)=Low LO(+)=High | { m5=OFF, m6=ON[RFin(+)] m9=ON, m10=OFF } | RFin(+) →PATH P1→ IFout(+)  L11 |
| | LO(-)=Low LO(+)=High | { m11=OFF, m12=ON[RFin(-)] m7=ON, m8=OFF } | RFin(-) →PATH P2→ IFout(-)  L12 |
| NEGATIVE LOGIC STATE | LO(-)=High LO(+)=Low | { m11=ON, m12=OFF m7=OFF, m8=ON[RFin(-)] } | RFin(-) →PATH P3→ IFout(+)  L13 |
| | LO(-)=High LO(+)=Low | { m5=ON, m6=OFF m9=OFF, m10=ON[RFin(+)] } | RFin(+) →PATH P4→ IFout(-)  L14 |

MIXER CIRCUIT FOR FREQUENCY MIXING OF DIFFERENTIAL SIGNALS

CROSS-REFERENCE TO RELATED APPLICATIONS

This application is based upon and claims the benefits of priority from the prior Japanese Patent Application No. 2008-086898, filed on Mar. 28, 2008, the entire contents of which are incorporated herein by reference.

BACKGROUND OF THE INVENTION

1. Field of the Invention

The present invention relates to a mixer circuit for frequency mixing of electrical signals.

2. Description of the Related Art

Frequency mixer circuits multiply two input signals with different frequencies and presents at their output a mixture of signals with new frequencies. They are used as frequency converters mainly in radio communication equipment such as cellular phones. Specifically, frequency mixer circuits (hereafter "mixer circuits") serve as upconversion mixers that convert an intermediate frequency (IF) signal to a radio frequency (RF) signal or downconversion mixers that convert an RF signal to an IF signal.

For portability, cellular phones are required to operate at a low supply voltage from batteries, with low power consumption, besides being small and lightweight. Accordingly, the mixer circuit used in such cellular phone devices is also required to operate properly at a low supply voltage.

As an example of conventional mixer circuits, a circuit structure using two stages of output transistors is proposed in Japanese Patent Application Publication No. 2003-234619, paragraph Nos. 0015 to 0017, FIG. 1 (referred to hereafter as "conventional technique #1"). Another example is a circuit structure using a single stage of output transistors, which is shown in Japanese Patent Application Publication No. 10-275193 (1998), paragraph Nos. 0022 and 0023, FIG. 2 (referred to hereafter as "conventional technique #2").

One drawback of such conventional mixers used in radio communication equipment is their narrow linear range, which distorts their output signals under low supply voltage conditions. In this technical field, a measure known as "output 1-dB compression point" (O1CP) is used to represent linearity performance of a circuit. O1CP of an electronic circuit refers to the output amplitude at which its linearity is reduced by 1 dB. For smaller input signals within a certain voltage range, the circuit exhibits a good linearity; i.e., the output voltage is proportional to the input voltage. The circuit, however, begins to behave in a non-linear fashion as the input voltage level is increased further. In this non-linear range, the actual output voltage falls below the theoretical output voltage. In other words, the input/output curve of a circuit deviates from its ideal linear curve. The deviation exceeding 1 dB means noticeable distortion of the output signal, or significant performance degradation.

As described above, O1CP of an electronic circuit indicates how linear it is; a higher O1CP value means a wider linear range. O1CP is degraded as the supply voltage decreases. It is therefore a challenge for the design engineer to minimize the degradation of O1CP so that the circuit can operate with sufficient linearity even under low supply voltage conditions.

Referring now to FIGS. 30 to 32, more details of conventional techniques #1 and #2 will be described below, including their shortcomings.

FIG. 30 illustrates a mixer circuit structure according to conventional technique #1. The illustrated mixer circuit 100 is formed from four P-channel metal oxide semiconductor (MOS) transistors MP1 to MP4, six N-channel MOS transistors MN1 to MN6, and two resistors RL1 and RL2. These components are arranged as follows.

One RF input terminal (RFin) is connected to the gate of transistor MP1. Another RF input terminal (RFinX) is connected to the gate of transistor MP2. One LO input terminal (LOin) is connected to the gates of transistors MN1 and MN4. Another LO input terminal (LOinX) is connected to the gates of transistors MN2 and MN3.

Power supply voltage Vdd is connected to the sources of transistors MP4 and MP3, as well as to one end of resistors RL1 and RL2. The gate of transistor MP4 is connected to the drain of transistor MP4 itself, the gate of transistor MP3, and the drain of transistor MN7.

The drain of transistor MP3 is connected to the sources of transistors MP1 and MP2. The drain of transistor MP1 is connected to the drain of transistor MN5, as well as to the sources of transistors MN1 and MN2. Likewise, the drain of transistor MP2 is connected to the drain of transistor MN6, as well as to the sources of transistors MN3 and MN4.

One IF output terminal (IFout) is connected to the other end of resistor RL1, as well as to the drains of transistors MN1 and MN3. Another IF output terminal (IFoutX) is connected to the other end of resistor RL2, as well as to the drains of transistors MN2 and MN4. Bias terminal is connected to the gates of transistors MN5, MN6, and MN7. The sources of transistors MN5 to MN7 are connected to the ground.

In operation, a differential pair of radio frequency signals RF (i.e., complementary signals RFin and RFinX) are converted into a differential pair of current signals by transistors MP1 and MP2. The resulting signals are directed back to differential transistor pairs MN1-MN2 and MN3-MN4 by transistors MN5 and MN6 serving as current sources. Differential local signal LO (i.e., complementary signals LOin and LOinX) switches their current paths, thereby multiplying the radio frequency signal RF by the local signal LO. The multiplication result is obtained as a differential pair of IF signals at one end of each load resistor RL1 and RL2.

The above-described conventional technique #1 is an application of Gilbert cell, which is an electronic multiplying mixer widely used in various fields. The Gilbert cell mixer is characterized by its cascode output section using two stacked transistors. One drawback of this cascode configuration is its limited linear range. This is also true for the conventional mixer circuit 100.

Specifically, the output section of the illustrated mixer circuit 100 is configured as a cascode of a differential MOS transistor pair MN1-MN2 and a single MOS transistor MN5, together with a cascode of another differential MOS transistor pair MN3-MN4 and another single MOS transistor MN6.

As mentioned earlier, those transistors MN1 to MN6 are N-channel MOS transistors. To make such N-channel MOS transistors operate in their saturation range, their drain-source voltage (Vds) has to be at least 400 mV peak-to-peak (mVpp). FIG. 31 gives an example of Ids-Vds characteristics of an N-channel MOS transistor. The vertical axis represents drain current (Ids), while the horizontal axis represents drain-source voltage. As can be seen from the illustrated graph, the drain current Ids of a transistor saturates at Vds=400 mV and above. The drain current does not change, however Vds increases, meaning that the transistor can work as a current source in the intended way.

The graph of FIG. 31 also indicates that Ids varies with Vds in the Vds range below 400 mV. In other words, the transistor behaves like a resistor, rather than a current source, in this voltage range.

Suppose now that the mixer circuit 100 operates at a relatively low supply voltage, e.g., Vdd=1.2 V. Under this condition, the voltage drop across resistor RL1 is at most 400 mVpp (=1200−400−400) since each transistor MN1 and MN5 requires a Vds of 400 mVpp. The other resistor RL2 behaves similarly, and the resulting differential output of the mixer circuit 100 will have a linear range of 800 mVpp (=(1200−400−400)×2).

As can be seen from the above example, Gilbert-cell mixers have a disadvantage in their narrow linear range (or low O1CP) because of the cascode structure of output transistors.

FIG. 32 illustrates a mixer circuit according to conventional technique #2. The illustrated mixer circuit 110 includes, among others, twelve MOS transistors Mn1 to Mn12, which are arranged as follows: One input terminal Vy(+) for a differential input signal Vy is connected to the gates of transistors Mn9 and Mn10, while another input terminal Vy(−) is connected to the gates of transistors Mn11 and Mn12. The drains of transistors Mn9 to Mn12 are connected to supply voltage Vcc. For another differential input signal Vx, one input terminal Vx(+) is connected to the gates of transistors Mn5 and Mn7, while another input terminal Vx(−) is connected to the gates of transistors Mn6 and Mn8. Io1 output terminal is connected to the drains of transistors Mn2 and Mn3. Io2 output terminal is connected to the drains of transistors Mn1 and Mn4.

The sources of transistors Mn1 to Mn8 are connected to the ground. The source of transistor Mn12 is connected to the gate of transistor Mn4, as well as to the drain of transistor Mn8. The source of transistor Mn11 is connected to the gate of transistor Mn3, as well as to the drain of transistor Mn7. The source of transistor Mn9 is connected to the gate of transistor Mn1, as well as to the drain of transistor Mn5. The source of transistor Mn10 is connected to the gate of transistor Mn2, as well as to the drain of transistor Mn6.

The mixer circuit 110 performs a mixing operation in the following way. Four MOS transistors Mn1 to Mn4 receive four different combinations (or sums) of differential input signals Vx and Vy at their respective gates. More specifically, transistor Mn1 receives −Vx+Vy; transistor Mn2 receives Vx+Vy; transistor Mn3 receives −Vx−Vy; and transistor Mn4 receives Vx−Vy. The drain currents of transistors Mn1 and Mn4 are added up, so are those of transistors Mn2 and Mn3. The resulting average current signals including product terms of Vx and Vy thus appear at the output terminals Io1 and Io2.

As mentioned, the outputs Io1 and Io2 of the mixer circuit 110 are current signals. Those current signals can be converted to voltage signals by placing a series resistor to each output line. Suppose now that a resistor Ra is inserted between the Io1 terminal and the node at which the drains of transistors Mn2 and Mn3 join. Likewise, suppose that a resistor Rb is inserted between the Io2 terminal and the node at which the drains of transistors Mn1 and Mn4 join.

Assuming that transistor Mn2 requires Vds of 400 mVpp for its operation at Vcc=1.2 V, the range of an output voltage developed across resistor Ra is 800 mVpp (=1200−400). Since its complementary counterpart (i.e., Mn1 and Rb) operates similarly, the linear range of differential output of the mixer circuit 110 is 1.6 Vpp (=(1.2−0.4)×2). This range is wider than that of the foregoing Gilbert-cell mixer circuit 100, under the same low supply voltage conditions (1.2 V). The mixer circuit 110 thus provides a higher O1CP.

As can be seen from the above discussion, the mixer circuit 110 of conventional technique #2 offers a wider linear range because of its single-transistor output stage. However, in the case of using a local signal (LO clock) with a rail-to-rail voltage swing, the mixer circuit 110 of conventional technique #2 does not operate properly since such a signal swing is beyond the linear range of the circuit. The following will provide more details about this problem.

The term "rail-to-rail" refers to a full swing of voltage, from the lowest to the highest of the operating range. In the case of, for example, complementary metal-oxide semiconductor (CMOS) logic, the lowest is ground (0 V), and the highest is the supply voltage.

Referring again to the mixer circuit 110 of FIG. 32, suppose that a rail-to-rail CMOS-level LO clock signal is applied to the Vx input terminals while a differential RF signal is supplied to the Vy input terminals. Assuming that the supply voltage Vcc is 1.2 V, the LO clock signal Vx takes a voltage of 1.2 V for the high state (i.e., +Vx=1.2 V) and 0 V for the low state (i.e., −Vx=0 V). Then in the case of Vy=+0.1V (i.e., +Vy=+0.1V, −Vy=−0.1V), the foregoing sums will be as follows:

$$Vx-Vy=1.2-0.1=1.1V$$

$$Vx+Vy=1.2+0.1=1.3V$$

$$-Vx-Vy=0-0.1=-0.1V$$

$$-Vx+Vy=0+0.1=0.1V$$

Since the operating voltage range is 0 V to 1.2 V, the mixer circuit is unable to output voltages higher than the supply voltage, or lower than the ground. The resulting clipping spoils the linearity of output signals.

Actually, the necessary condition to ensure the linearity of output signals is as follows:

$$Vx-Vy=1.2-Vy \leq 1.2 \tag{1a}$$

$$Vx+Vy=1.2+Vy \leq 1.2 \tag{1b}$$

$$-Vx-Vy=0-Vy \geq 0 \tag{1c}$$

$$-Vx+Vy=0+Vy \geq 0 \tag{1d}$$

The input signal Vy must satisfy all those four conditions (1a) to (1d) under the presumption of: (a) the circuit cannot produce a voltage exceeding the supply voltage, (b) the circuit cannot produce a voltage below ground, and (c) Vx is an LO clock signal with a rail-to-rail voltage swing.

The first two conditions (1a) and (1b), or the second two conditions (1c) and (1d), result in $0 \geq Vy \leq 0$, or Vy=0. This means that the mixer circuit 110 of conventional techniques #2 is unable to provide linear outputs, thus failing to operate properly with a rail-to-rail LO clock signal.

An LO clock signal with a smaller voltage swing may be used instead of the rail-to-rail signal discussed above. In general, however, reducing the voltage swing makes the mixer circuit prone to experience intrusion of unwanted phase noise or the like. To avoid such problems, the recent mixer designs tend to use a rail-to-rail LO clock. This contradicts the requirement of output linearity discussed above.

The above discussion is summarized as follows. Conventional technique #1 has a drawback in its limited linear range because of the circuit's cascode structure. A low supply voltage could lead to a narrow linearity that spoils stability of the output. It is therefore unsuitable for low voltage applications.

Conventional technique #2 also has a drawback in its limited linear range when the LO clock signal swings rail-to-rail.

Mixer circuits are required to provide a sufficient linear range for accurate mixing operation, even at a low supply voltage. However, neither of the conventional techniques is suitable for such low voltage operation.

SUMMARY OF THE INVENTION

In view of the foregoing, it is an object of the present invention to provide a mixer circuit that permits CMOS-level rail-to-rail input signals, besides offering a sufficient linear range for accurate mixing operation even under low supply voltage conditions.

To accomplish the above object, the present invention provides a mixer circuit for mixing signals. This mixer circuit includes an input terminal section, a local signal terminal section, an output terminal section, first to fourth input sections, a positive output section, and a negative output section. The input terminal section includes positive and negative input terminals for respectively receiving positive and negative input signals that constitute a differential input signal. The local signal terminal section includes positive and negative local signal terminals for receiving a differential local signal. The output terminal section includes positive and negative output terminals for outputting a differential output signal representing results of mixing the differential input signal and the differential local signal. The first input section includes the following elements: a first transistor whose gate is coupled to the positive input terminal, a second transistor whose gate is coupled to the negative local signal terminal, and a first load resistor connected to a first node at which drains of the first and second transistors are connected together. The second input section includes the following elements: a third transistor whose gate is coupled to the negative input terminal, a fourth transistor whose gate is coupled to the positive local signal terminal, and a second load resistor connected to a second node at which drains of the third and fourth transistors are connected together. The third input section includes the following elements: a fifth transistor whose gate is coupled to the positive input terminal, a sixth transistor whose gate is coupled to the positive local signal terminal, and a third load resistor connected to a third node at which drains of the fifth and sixth transistors are connected together. The fourth input section includes the following elements: a seventh transistor whose gate is coupled to the negative input terminal, an eighth transistor whose gate is coupled to the negative local signal terminal, and a fourth load resistor connected to a fourth node at which drains of the seventh and eighth transistors are connected together. The positive output section includes the following elements: a ninth transistor whose drain is connected to the positive output terminal, a tenth transistor whose drain is connected to the positive output terminal, and a fifth load resistor connected to a fifth node at which the drains of the ninth and tenth transistors are connected together. Here the ninth transistor is driven by a first signal supplied from the first input section via the first node, and the tenth transistor is driven by a second signal supplied from the second input section via the second node. The negative output section includes the following elements: an eleventh transistor whose drain is connected to the negative output terminal, a twelfth transistor whose drain is connected to the negative output terminal, and a sixth load resistor connected to a sixth node at which the drains of the eleventh and twelfth transistors are connected together. Here the eleventh transistor is driven by a third signal supplied from the third input section via the third node, and the twelfth transistor is driven by a fourth signal supplied from the fourth input section via the fourth node.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIG. 4 illustrates signal propagation paths.

FIG. 5 summarizes path selection according to the logic state of a local signal.

FIG. 22 illustrates signal propagation paths.

FIG. 23 summarizes path selection according to the logic state of a local signal.

DESCRIPTION OF THE PREFERRED EMBODIMENTS

Figure 1:
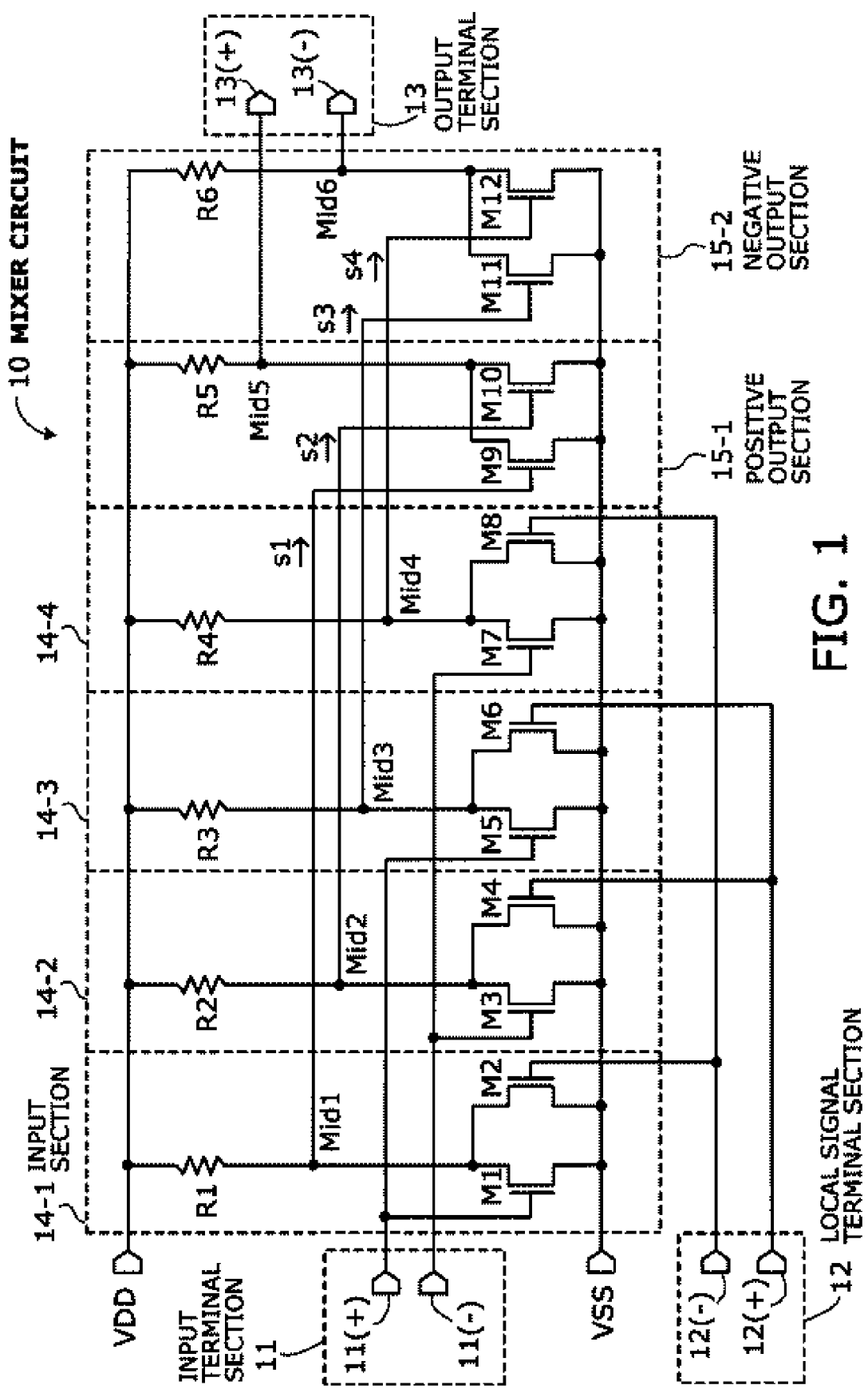
FIG. 1 illustrates a block structure of a mixer circuit according to an embodiment of the present invention.

Preferred embodiments of the present invention will be described below with reference to the accompanying drawings, wherein like reference numerals refer to like elements throughout.

FIG. 1 illustrates a block structure of a mixer circuit according to an embodiment of the present invention. The illustrated mixer circuit 10 is formed from an input terminal section 11, a local signal terminal section 12, an output terminal section 13, first to fourth input sections 14-1 to 14-4, a positive output section 15-1, and a negative output section 15-2. All transistors M1 to M12 shown in FIG. 1 are, for example, N-channel metal oxide semiconductor field effect transistors (MOSFET), arranged as common-source amplifiers.

The input terminal section 11 includes a positive input terminal 11(+) and a negative input terminal 11(−) for receiving positive and negative signals constituting a differential input signal. The local signal terminal section 12 includes a positive local signal terminal 12(+) and a negative local signal terminal 12(−) for receiving a differential local signal. The output terminal section 13 includes a positive output terminal 13(+) and a negative output terminal 13(−) for outputting a differential output signal representing the results of mixing operation.

Note here that the qualifiers "positive" and "negative" (and the plus and minus signs corresponding thereto) are used to refer to "non-inverted" and "inverted" components involved in differential signaling, rather than the polarity of electric potentials. For example, the positive signal mentioned above is a non-inverted input signal, one of the two complementary signals constituting a differential input signal. For another example, the negative output terminal 13(−) is an output terminal for an inverted output signal, one of the two complementary signals constituting a differential output signal. This usage of the words "positive" and "negative" applies throughout the description unless otherwise noted.

Referring again to FIG. 1, the first input section 14-1 includes a first transistor (transistor M1) whose gate is coupled to the positive input terminal 11(+), a second transistor (transistor M2) whose gate is coupled to the negative local signal terminal 12(−), and a first load resistor (resistor R1), one end of which is connected to a first node (Mid1) at which the drains of transistors M1 and M2 are connected together.

The second input section 14-2 includes a third transistor (transistor M3) whose gate is coupled to the negative input terminal 11(−), a fourth transistor (transistor M4) whose gate is coupled to the positive local signal terminal 12(+), and a second load resistor (resistor R2), one end of which is connected to a second node (Mid2) at which the drains of transistors M3 and M4 are connected together.

The third input section 14-3 includes a fifth transistor (transistor M5) whose gate is coupled to the positive input terminal 11(+), a sixth transistor (transistor M6) whose gate is coupled to the positive local signal terminal 12(+), and a third load resistor (resistor R3), one end of which is connected to a third node (Mid3) at which the drains of transistors M5 and M6 are connected together.

The fourth input section 14-4 includes a seventh transistor (transistor M7) whose gate is coupled to the negative input terminal 11(−), an eighth transistor (transistor M8) whose gate is coupled to the negative local signal terminal 12(−), and a fourth load resistor (resistor R4), one end of which is connected to a fourth node (Mid4) at which the drains of transistors M7 and M8 are connected together.

The positive output section 15-1 includes transistor M9 whose gate is connected to node Mid1, transistor M10 whose gate is connected to node Mid2, and a fifth load resistor (resistor R5). One end of resistor R5 is connected to a fifth node (Mid5) at which the drains of transistors M9 and M10 are connected together. The positive output terminal 13(+) is connected to this node Mid5.

Transistor M9 is driven by a first signal (signal s1) supplied from the first input section 14-1 via node Mid1. Likewise, transistor M10 is driven by a second signal (signal s2) supplied from the second input section 14-2 via node Mid2. Signal s1 is a voltage that is developed across resistor R1 by a drain current of transistor M1 when it is turned on. Signal s2 is a voltage that is developed across resistor R2 by a drain current of transistor M3 when it is turned on.

The negative output section 15-2 includes transistor M11 whose gate is connected to node Mid3, transistor M12 whose gate is connected to node Mid4, and a sixth load resistor (resistor R6). One end of resistor R6 is connected to a sixth node (Mid6) at which the drains of transistors M11 and M12 are connected together. The negative output terminal 13(−) is connected to this node Mid6.

Transistor M11 is driven by a third signal (signal s3) supplied from the third input section 14-3 via node Mid3. Likewise, transistor M12 is driven by a fourth signal (signal s4) supplied from the fourth input section 14-4 via node Mid4. Signal s3 is a voltage that is developed across resistor R3 by a drain current of transistor M5 when it is turned on. Signal s4 is a voltage that is developed across resistor R4 by a drain current of transistor M7 when it is turned on.

Figure 2:
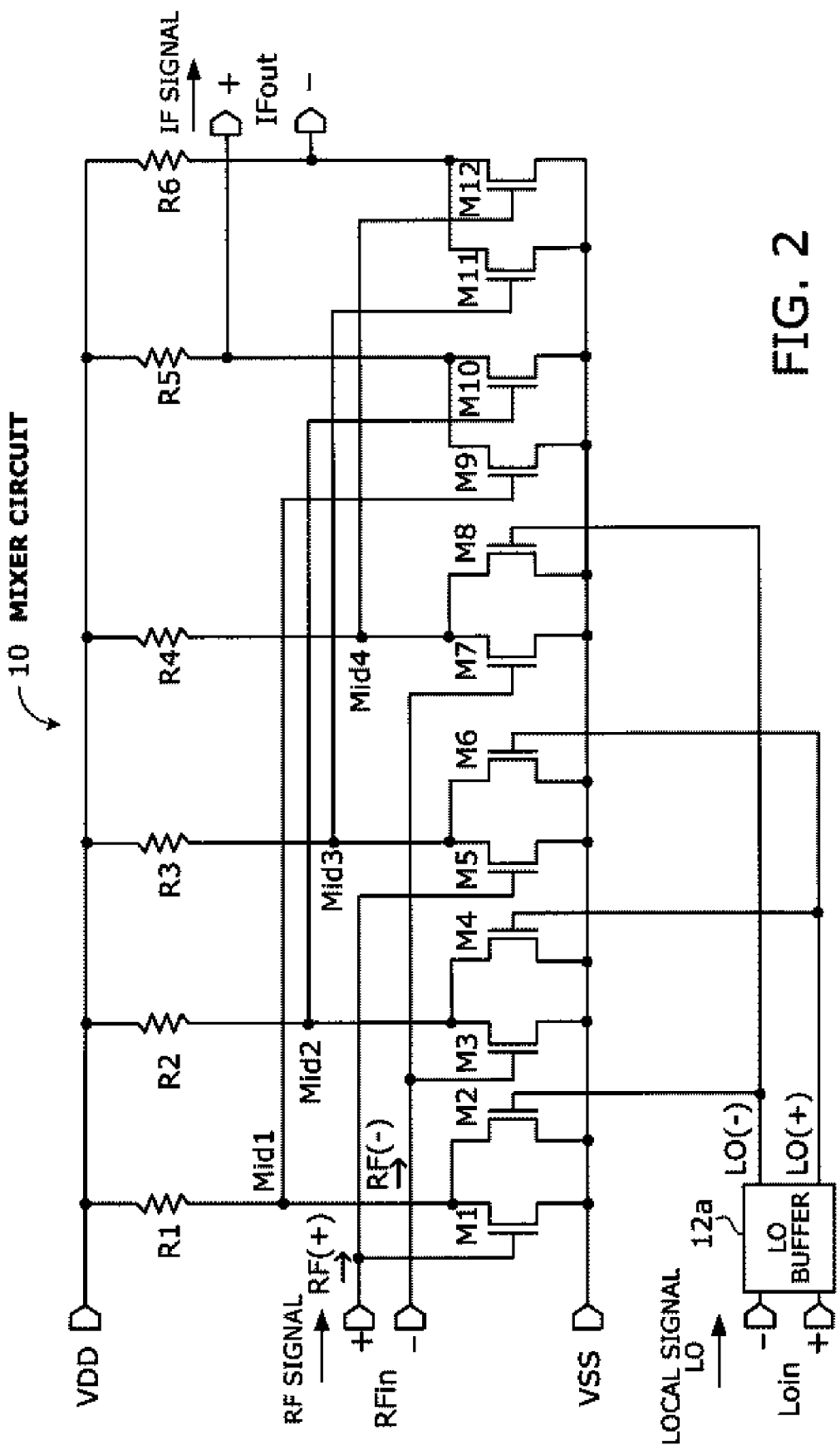
FIG. 2 illustrates a mixer circuit.

The following will now describe in detail the structure and operation of the above mixer circuit 10. FIG. 2 illustrates the structure of the mixer circuit 10, which is formed as follows:

Input terminal RFin(+) is connected to the gates of transistors M1 and M5, while input terminal RFin(−) is connected to those of transistors M3 and M7. Local input terminals LOin(−) and LOin(+) are connected to an LO buffer 12a. One output LO(−) of this LO buffer 12a is connected to the gates of transistors M2 and M8, while the other output LO(+) of the same is connected to the gates of transistors M4 and M6.

The role of the LO buffer 12a is to convert the local signals LO to CMOS-level signals. It is therefore possible to eliminate this LO buffer 12a in the case where the signals at the LOin(−) and LOin(+) terminals have a CMOS voltage swing in the first place.

Power supply voltage VDD is delivered to one end of each resistor R1 to R6. Connected to the ground voltage VSS are the sources of transistors M1 to M12. The other end of resistor R1 is connected to the drains of transistors M1 and M2, as well as to the gate of transistor M9. The other end of resistor R2 is connected to the drains of transistors M3 and M4, as well as to the gate of transistor M10. The other end of resistor R3 is connected to the drains of transistors M5 and M6, as well as to the gate of transistor M11. The other end of resistor R4 is connected to the drains of transistors M7 and M8, as well as to the gate of transistor M12. The other end of resistor R5 is connected to the drains of transistors M9 and M10, as well as to positive output terminal IFout(+). The other end of resistor R6 is connected to the drains of transistors M11 and M12, as well as to negative output terminal IFout(−).

Principle of Frequency Mixing Operation

Figure 3:
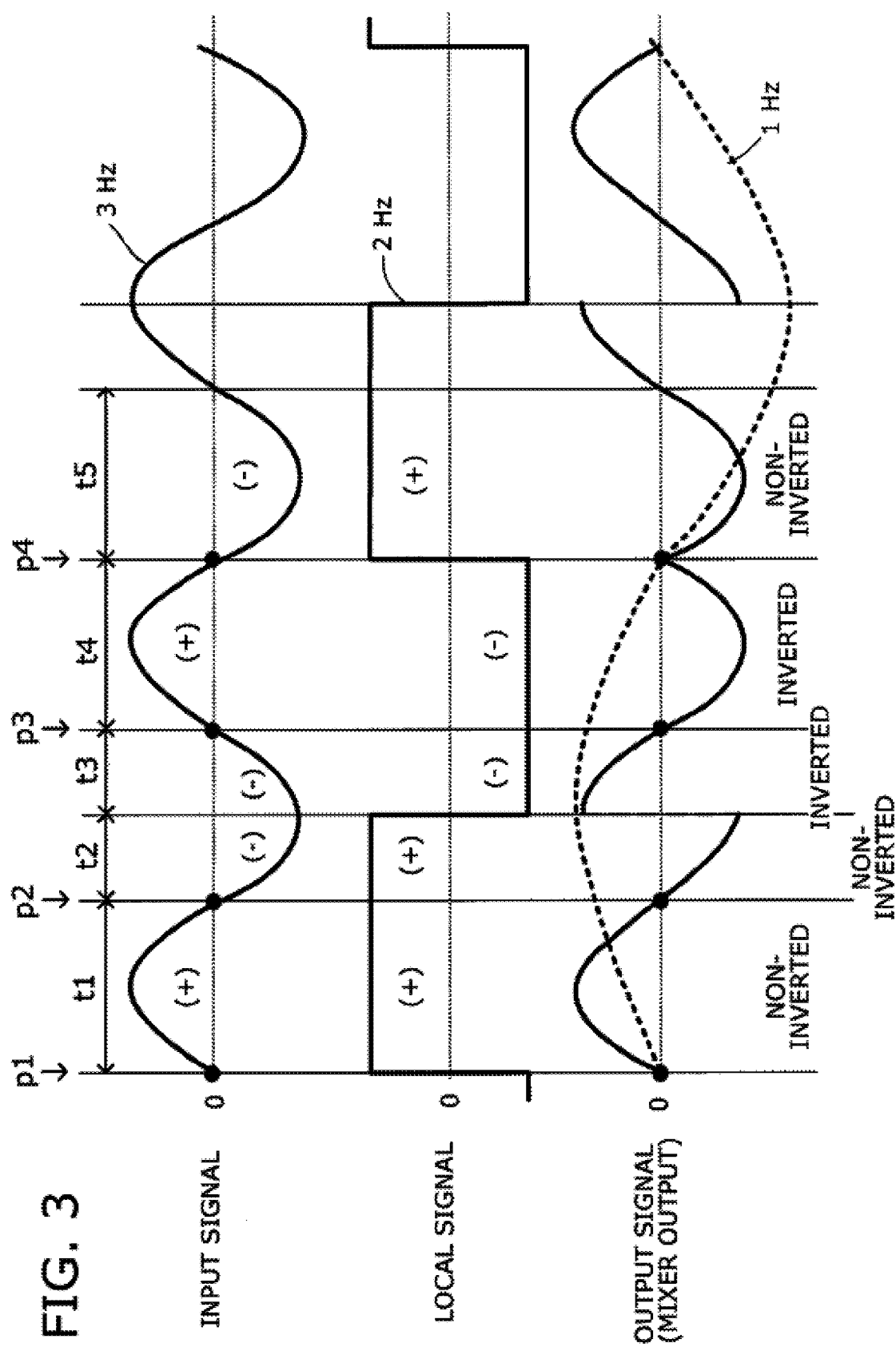
FIG. 3 illustrates how an input signal is mixed with a local signal.

Referring now to FIG. 3, this section will give a general overview of mixing operation before going to details of how the mixer circuit 10 operates. FIG. 3 illustrates how an output voltage signal is obtained through multiplication of an input signal and a square-wave local signal. For explanatory purposes, it is assumed that the input signal is a sine signal with a frequency of 3 Hz while the local signal is a bipolar square-wave signal with a frequency of 2 Hz. In the present section, the words "positive" and "negative" are used to refer to the polarities of electric potential relative to the zero level.

[Point p1] Since the input signal is zero, the output signal (i.e., the multiplication result) is also zero.

[Section t1] Since both the input signal and local signal are positive (+), the product, or the multiplication result, is positive (+). This resulting polarity (+) agrees with the input signal polarity (+). Accordingly, the output signal waveform in section t1 is identical with the input signal waveform (i.e., non-inverted version of the input signal).

[Point p2] Since the input signal is zero, the output signal is zero.

[Section t2] Since the input signal is negative (−) whereas the local signal is positive (+), their product is negative (−). This resulting polarity (−) agrees with the input signal polarity (−). Accordingly, the output signal waveform in section t2 is identical with the input signal waveform (i.e., non-inverted version of the input signal).

[Section t3] Since both the input signal and local signal are negative (−), their product is positive (+). This resulting polarity (+) disagrees with the input signal polarity (−). Accordingly, the output signal waveform in section t3 is an inverted version of the input signal waveform.

[Point p3] Since the input signal is zero, the output signal is zero.

[Section t4] Since the input signal is positive (+) whereas the local signal is negative (−), their product is negative (−). This resulting polarity (−) disagrees with the input signal polarity (+). Accordingly, the output signal waveform in section t4 is an inverted version of the input signal waveform.

[Point p4] Since the input signal is zero, the output signal is zero.

[Section t5] Since the input signal is negative (−) whereas the local signal is positive (+), their product is negative (−). This resulting polarity (−) agrees with the input signal polarity (−). Accordingly, the output signal waveform in section t5 is identical with the input signal waveform (i.e., non-inverted version of the input signal). The signal mixing continues in this way.

The above-described process multiplies the 3-Hz input signal by the 2-Hz local signal, thereby producing a 1-Hz output signal as indicated by the dotted line in FIG. 3. That is, the mixer's output frequency is a difference between the input signal frequency and local signal frequency.

The above explanation divided the time axis into short sections based on the polarities of input and local signals in order to emphasize the multiplication of those signals. However, the above-described mixing operation may be described in a simpler way. That is, the mixer outputs the input signal as is (i.e., without inverting) when the local signal is positive. The mixer inverts the input signal when the local signal is negative.

Operation of Proposed Mixer Circuit

Referring now to FIG. 4, the operation of the proposed mixer circuit 10 will be described in detail below. FIG. 4 summarizes various signal propagation paths created in the mixer circuit 10 of FIG. 2. The mixer circuit 10 provides those paths to permit signals to propagate from input terminals to output terminals. Specifically, paths P1 to P4 are created as follows:

[Path P1] Non-inverted RF signal RF(+) at input terminal RFin(+) is directed to the gate of transistor M1. Driven by this RF(+) signal, transistor M1 turns on, and the resulting drain current flows through resistor R1, thus producing at node Mid1 a voltage proportional to the RF(+) voltage. The produced voltage is applied to the gate of transistor M9, thus turning on transistor M9. The resulting drain current flows through resistor R5, which causes a voltage proportional to the RF(+) voltage to appear at output terminal IFout(+).

[Path P2] Inverted RF signal RF(−) at input terminal RFin(−) is directed to the gate of transistor M7. Driven by this RF(−) signal, transistor M7 turns on, and the resulting drain current flows through resistor R4, thus producing at node Mid4 a voltage proportional to the RF(−) voltage. The produced voltage is applied to the gate of transistor M12, thus turning on transistor M12. The resulting drain current flows through resistor R6, which causes a voltage proportional to the RF(−) voltage to appear at output terminal IFout(−).

[Path P3] Inverted RF signal RF(−) at input terminal RFin(−) is directed to the gate of transistor M3. Driven by this RF(−) signal, transistor M3 turns on, and the resulting drain current flows through resistor R2, thus producing at node Mid2 a voltage proportional to the RF(−) voltage. The produced voltage is applied to the gate of transistor M10, thus turning on transistor M10. The resulting drain current flows through resistor R5, which causes a voltage proportional to the RF(−) voltage to appear at output terminal IFout(+).

[Path P4] Non-inverted RF signal RF(+) at input terminal RFin(+) is directed to the gate of transistor M5. Driven by this RF(+) signal, transistor M5 turns on, and the resulting drain current flows through resistor R3, thus producing at node Mid3 a voltage proportional to the RF(+) voltage. The produced voltage is applied to the gate of transistor M11, thus turning on transistor M11. The resulting drain current flows through resistor R6, which causes a voltage proportional to the RF(+) voltage to appear at output terminal IFout(−).

Mixing of signals is achieved by selecting paths of RF signals according to LO signals. FIG. 5 summarizes how this path selection is made depending on the logic state of the local signal LO. FIGS. 6 to 9 depict each path produced in the circuit, using bold lines for emphasis. The differential local signal LO may be in positive logic state or negative logic state. The following will describe the operation in each case of LO logic state.

(a) Local Signal in Positive Logic State

The positive logic state of local signal LO is represented by LOin(+)=High and LOin(−)=Low. The corresponding outputs of the LO buffer 12a are LO(+)=High and LO(−)=Low in terms of CMOS voltage levels.

Transistor State:

When LO(−)=Low, transistor M2 is turned off, which permits transistor M1 to be turned on according to RFin(+) input. FIG. 5 represents this state as {M1=ON[RFin(+)], M2=OFF}. Likewise, transistor M8 is turned off, which permits transistors M7 to be turned on according to RFin(−) input. FIG. 5 represents this state as {M7=ON[RFin(−)], M8=OFF}.

When LO(+)=High, transistor M4 is turned on, which effectively disables transistor M3 coupled thereto. FIG. 5 represents this state as {M3=OFF, M4=ON}. Likewise, transistor M6 is turned on, which effectively disables transistor M5 coupled thereto. FIG. 5 represents this state as {M5=OFF, M6=ON}

Figure 6:
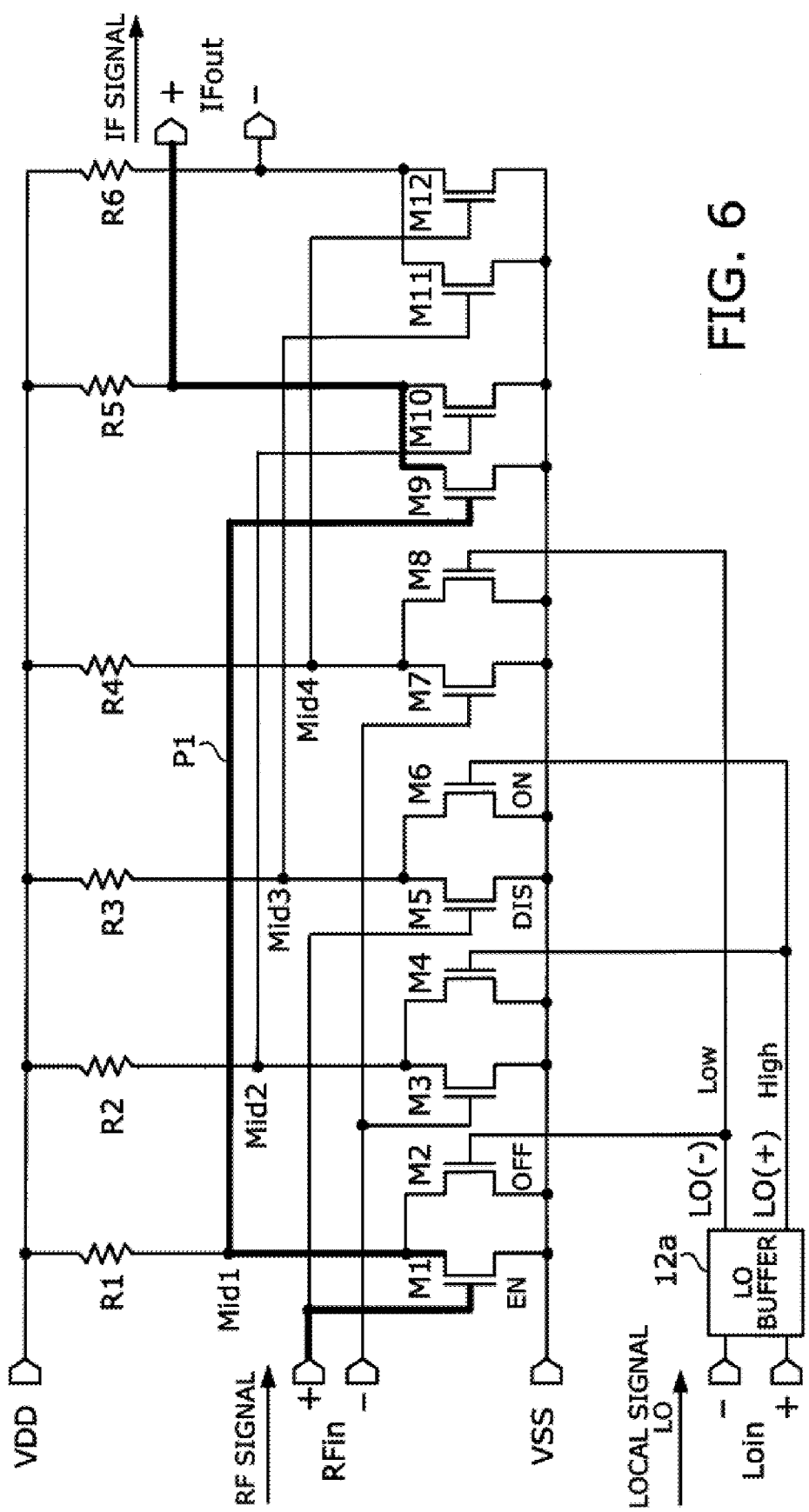
FIGS. 6 to 9 illustrate each signal path produced in the circuit.

Selection of Path P1:

FIG. 6 depicts path P1, which is created when LO(−)=Low and LO(+)=High as shown in section L1 of FIG. 5. LO(−)=Low turns off transistor M2 and thus enables transistor M1 to operate with RFin(+) input. LO(+)=High turns on transistor M6 and, in effect, disables transistor M5. Accordingly, the non-inverted RF signal RF(+) at input terminal RFin(+) propagates through path P1, rather than P4, and thus it reaches output terminal IFout(+). The output voltage in this case is expressed as $$IFout(+) = A_1 \times RFin(+)$$

where $A_1 = (gm_{M1} \times R1) \times (gm_{M9} \times R5)$. $gm_{MN}$ represents mutual conductance of the nth transistor Mn (MOSFET), which means how much the drain current varies with a small change in the gate voltage ($gm = \Delta Ids/\Delta Vgs$).

In addition, when the local signal LO is in positive logic state, LO(+)=High turns on transistor M4, which pulls node Mid2 down to a very low voltage. To be more precise, this Mid2 voltage is determined by the ratio between the on-resistance (or output impedance in on-state) of transistor M4 and the resistance of resistor R2. The voltage has to be lower than the threshold voltage Vt of transistor M10, so as to ensure that the "on" state of transistor M4 prevents transistor M10 from turning on when path P1 is selected.

Figure 7:
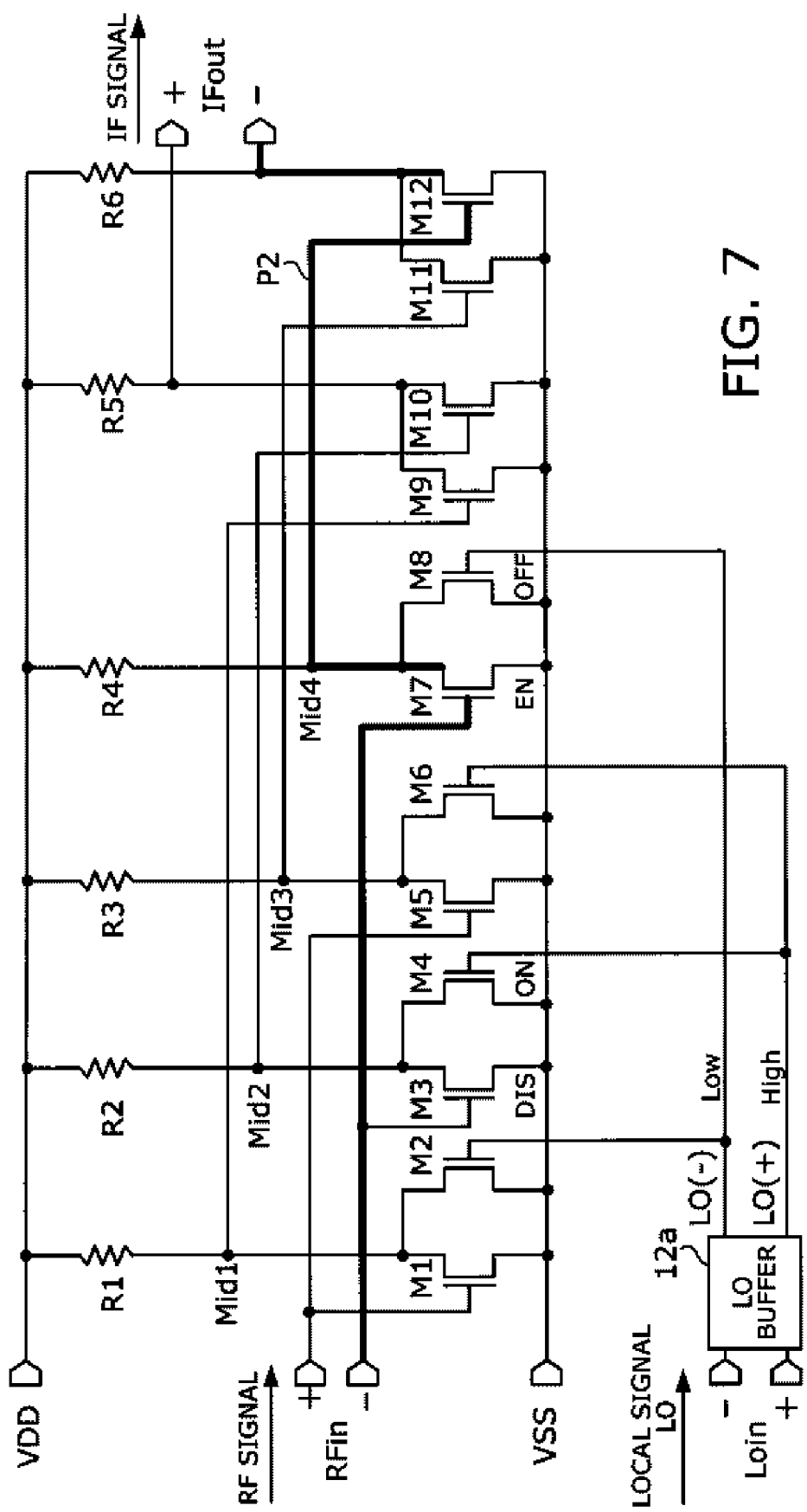

Selection of Path P2:

FIG. 7 depicts path P2, which is created when LO(−)=Low and LO(+)=High as shown in section L2 of FIG. 5. LO(−)=Low turns off transistor M8 and thus enables transistor M7 to operate with RFin(−) input. LO(+)=High turns on transistor M4 and, in effect, disables transistor M3. Accordingly, the inverted RF signal RF(−) at input terminal RFin(−) propagates through path P2, rather than P3, and thus it reaches output terminal IFout(−). The output voltage in this case is expressed as $$IFout(-)=A_2 \times RFin(-)$$

where $A_2=(gm_{M7} \times R4) \times (gm_{M12} \times R6)$.

In addition, when the local signal is in positive logic state, LO(+)=High turns on transistor M6, which pulls node Mid3 down to a very low voltage. To be more precise, this Mid3 voltage is determined by the ratio between the on-resistance of transistor M6 and the resistance of resistor R3. The voltage has to be lower than the threshold voltage Vt of transistor M11, so as to ensure that the "on" state of transistor M6 prevents transistor M11 from turning on when path P2 is selected.

As described above, when the differential local signal LO is in positive logic state (i.e., LOin(+)=High and LOin(−)=Low), the non-inverted RF signal RF(+) propagates from input terminal RFin(+) to output terminal IFout(+), while the inverted RF signal RF(−) propagates from input terminal RFin(−) to output terminal IFout(−). This corresponds exactly to what has been described as a general mixing operation in FIG. 3. That is, when the local signal is high, the mixer circuit outputs a non-inverted version of the input signal.

(b) Local Signal in Negative Logic State

The negative logic state of local signal LO is represented by LOin(+)=Low and LOin(−)=High. The corresponding outputs of the LO buffer 12a are LO(+)=Low and LO(−)=High in terms of CMOS voltage levels.

Transistor State:

When LO(−)=High, transistor M2 is turned on, which effectively disables transistor M1 coupled thereto. FIG. 5 represents this state as {M1=OFF, M2=ON}. Likewise, transistor M8 is turned on, which effectively disables transistor M7 coupled thereto. FIG. 5 represents this state as {M7=OFF, M8=ON}.

When LO(−)=Low, transistor M4 is turned off, which permits transistor M3 to be turned on according to RFin(−) input. FIG. 5 represents this state as {M3=ON[RFin(−)], M4=OFF}. Likewise, transistor M6 is turned off, which permits transistors M5 to be turned on according to RFin(+) input. FIG. 5 represents this state as {M5=ON[RFin(+)], M6=OFF}.

Figure 8:
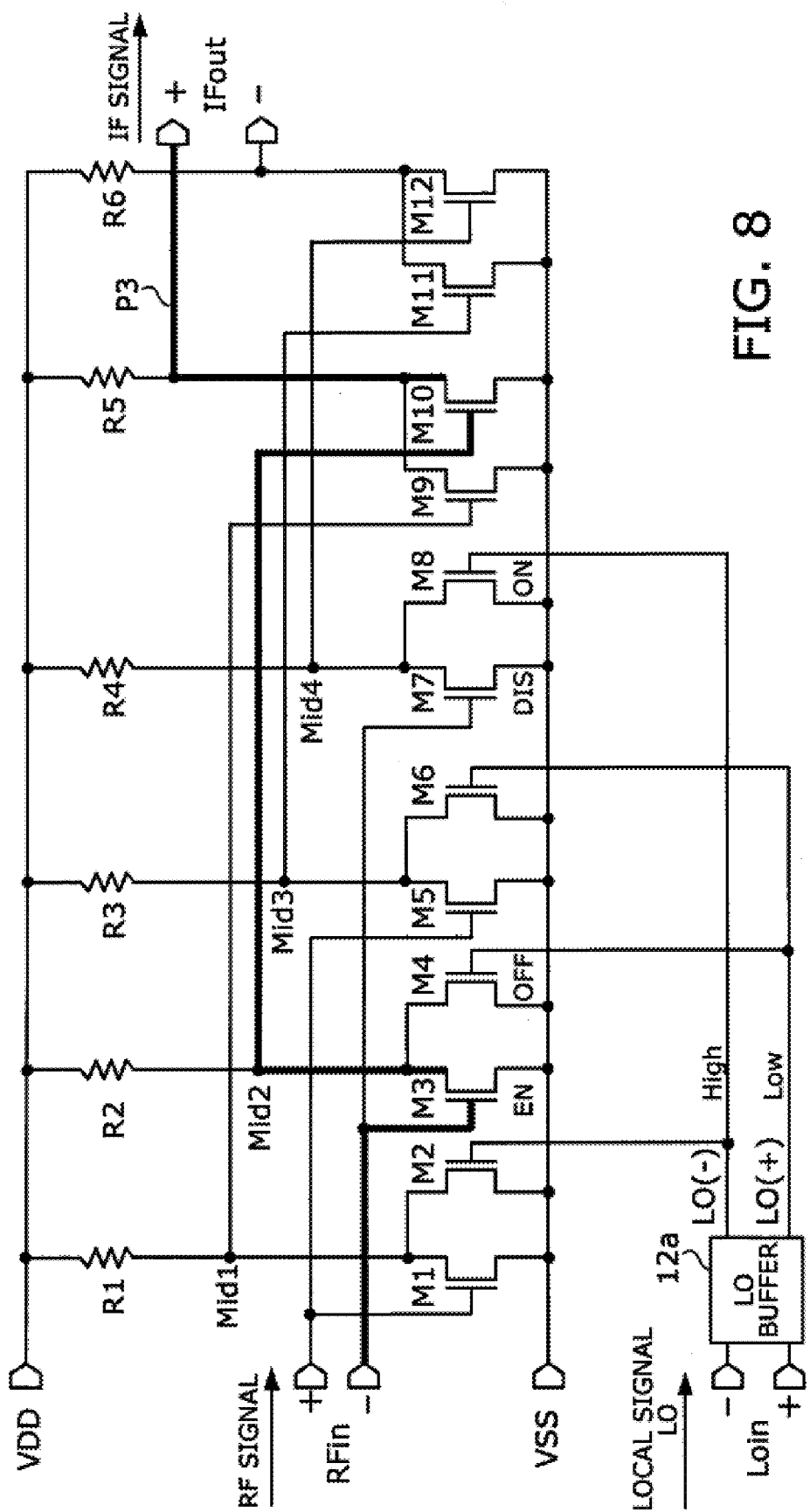

Selection of Path P3:

FIG. 8 depicts path P3, which is created when LO(−)=High and LO(+)=Low as shown in section L3 of FIG. 5. LO(−)=High turns on transistor M8 and, in effect, disables transistor M7. LO(+)=Low turns off transistor M4 and thus enables transistor M3 to operate with RFin(−) input. Accordingly, the inverted RF signal RF(−) at input terminal RFin(−) propagates through path P3, rather than P2, and thus it reaches output terminal IFout(+). The output voltage in this case is expressed as $$IFout(+)=A_3 \times RFin(-)$$

where $A_3=(gm_{M3} \times R2) \times (gm_{M10} \times R5)$.

In addition, when the local signal LO is in negative logic state, LO(−)=High turns on transistor M2, which pulls node Mid1 down to a very low voltage. To be more precise, this Mid1 voltage is determined by the ratio between the on-resistance of transistor M2 and the resistance of resistor R1. The voltage has to be lower than the threshold voltage Vt of transistor M9, so as to ensure that the "on" state of transistor M2 prevents transistor M9 from turning on when path P3 is selected.

Figure 9:
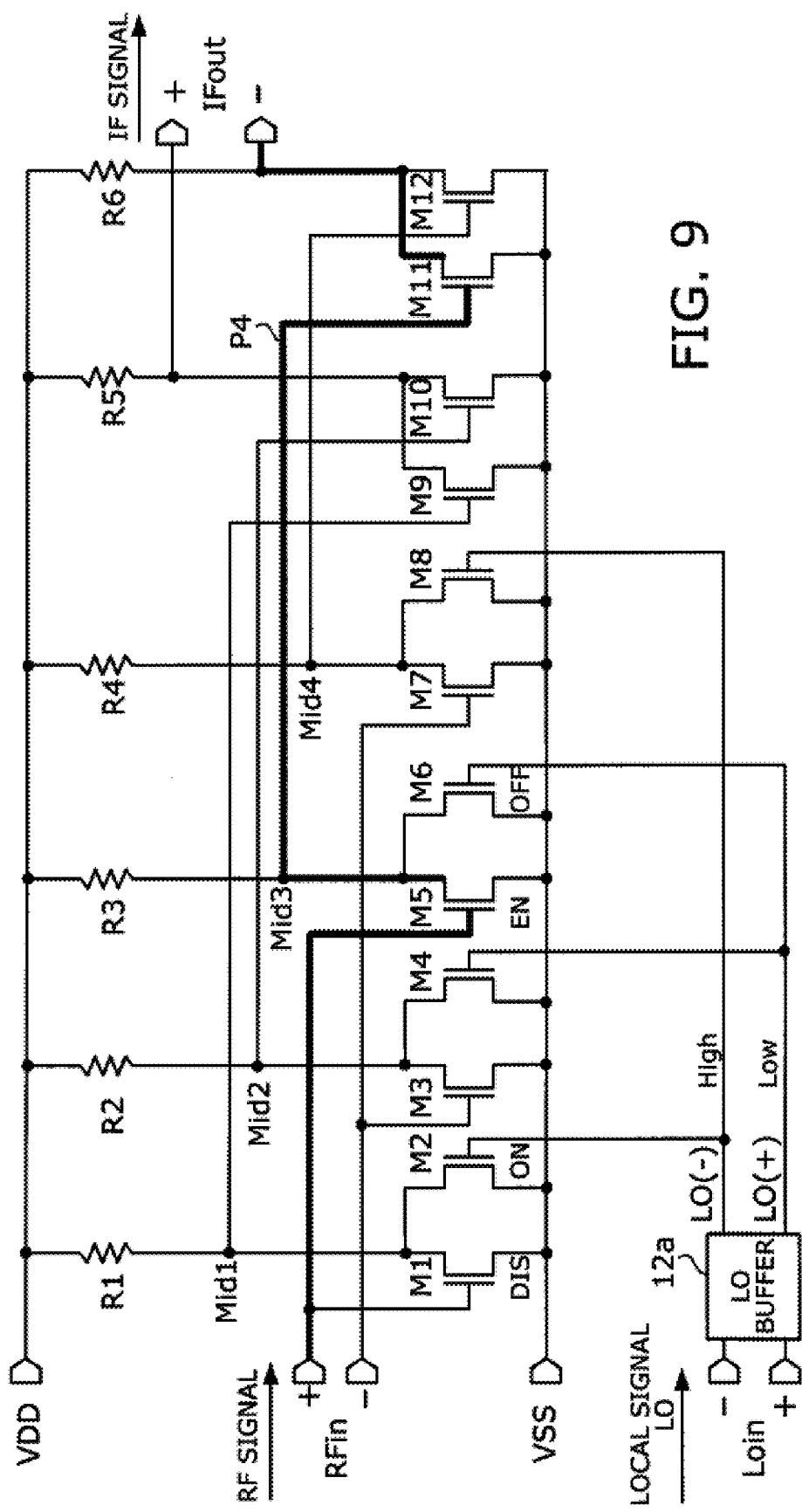

Selection of Path P4:

FIG. 9 depicts path P4, which is created when LO(−)=High and LO(+)=Low as shown in section L4 of FIG. 5. LO(−)=High turns on transistor M2 and, in effect, disables transistor M1. LO(+)=Low turns off transistor M6 and thus enables transistor M5 to operate with RFin(+) input. Accordingly, the non-inverted RF signal RF(+) at input terminal RFin(+) propagates through path P4, rather than P1, and thus it reaches output terminal IFout(−). The output voltage in this case is expressed as $$IFout(-)=A_4 \times RFin(+)$$

where $A_4=(gm_{M5} \times R3) \times (gm_{M11} \times R6)$.

In addition, when the local signal LO is in negative logic state, LO(−)=High turns on transistor M8, which pulls node Mid4 down to a very low voltage. To be more precise, this Mid4 voltage is determined by the ratio between the on-resistance of transistor M8 and the resistance of resistor R4. The voltage has to be lower than the threshold voltage Vt of transistor M12, so as to ensure that the "on" state of transistor M8 prevents transistor M12 from turning on when path P4 is selected.

As described above, when the differential local signal LO is in negative logic state (i.e., LOin(+)=Low and LOin(−)=High), the inverted RF signal RF(−) propagates from input terminal RFin(−) to output terminal IFout(+), while the non-inverted RF signal RF(+) propagates from input terminal RFin(+) to output terminal IFout(−). This corresponds exactly to what has been described as a general mixing operation in FIG. 3. That is, when the local signal is low, the mixer circuit outputs an inverted version of the input signal.

Simulation Results

Figure 10:
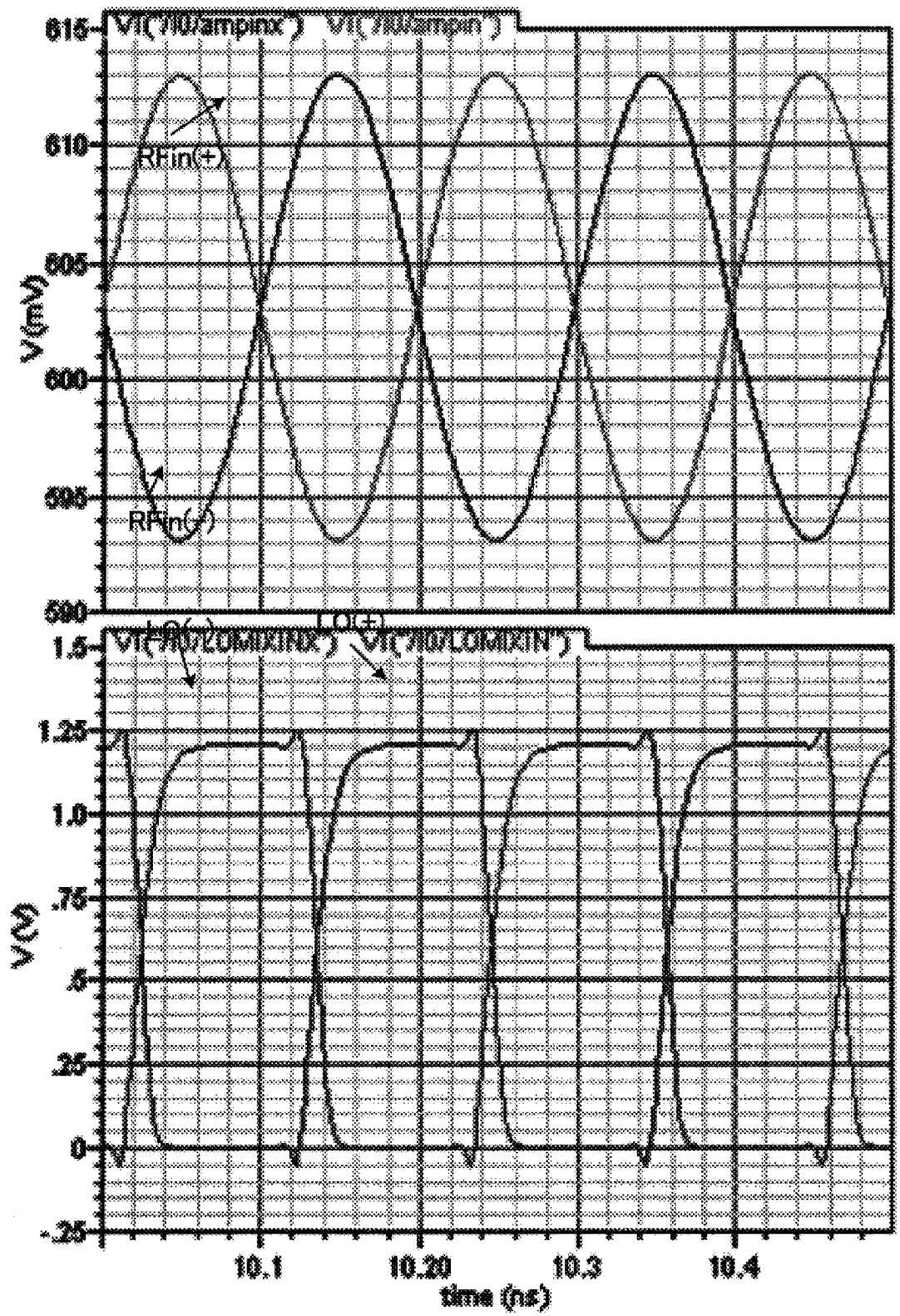
FIG. 10 illustrates an input signal and a local signal supplied to the mixer circuit.
Figure 11:
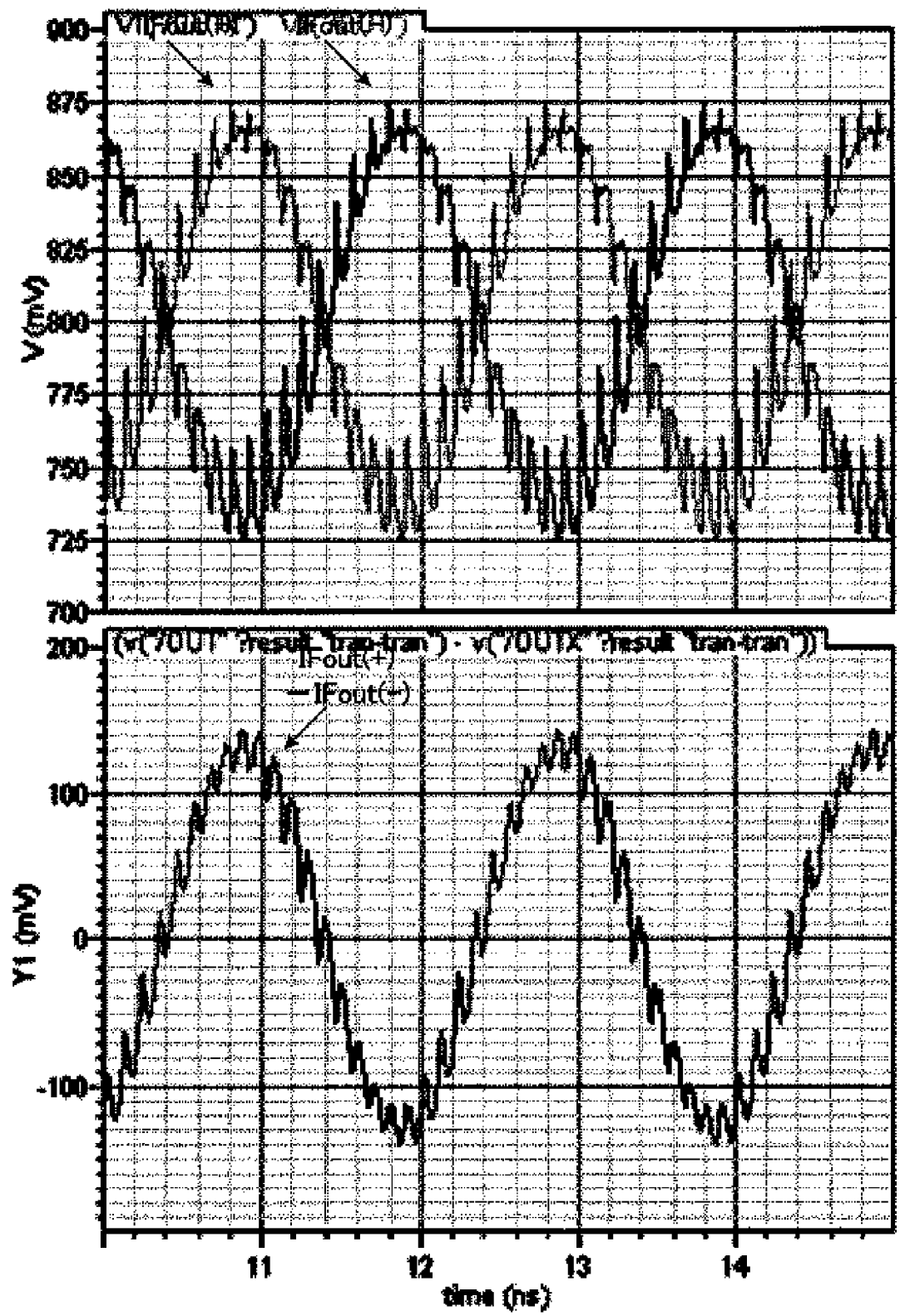
FIG. 11 illustrates an output signal of the mixer circuit.
Figure 12:
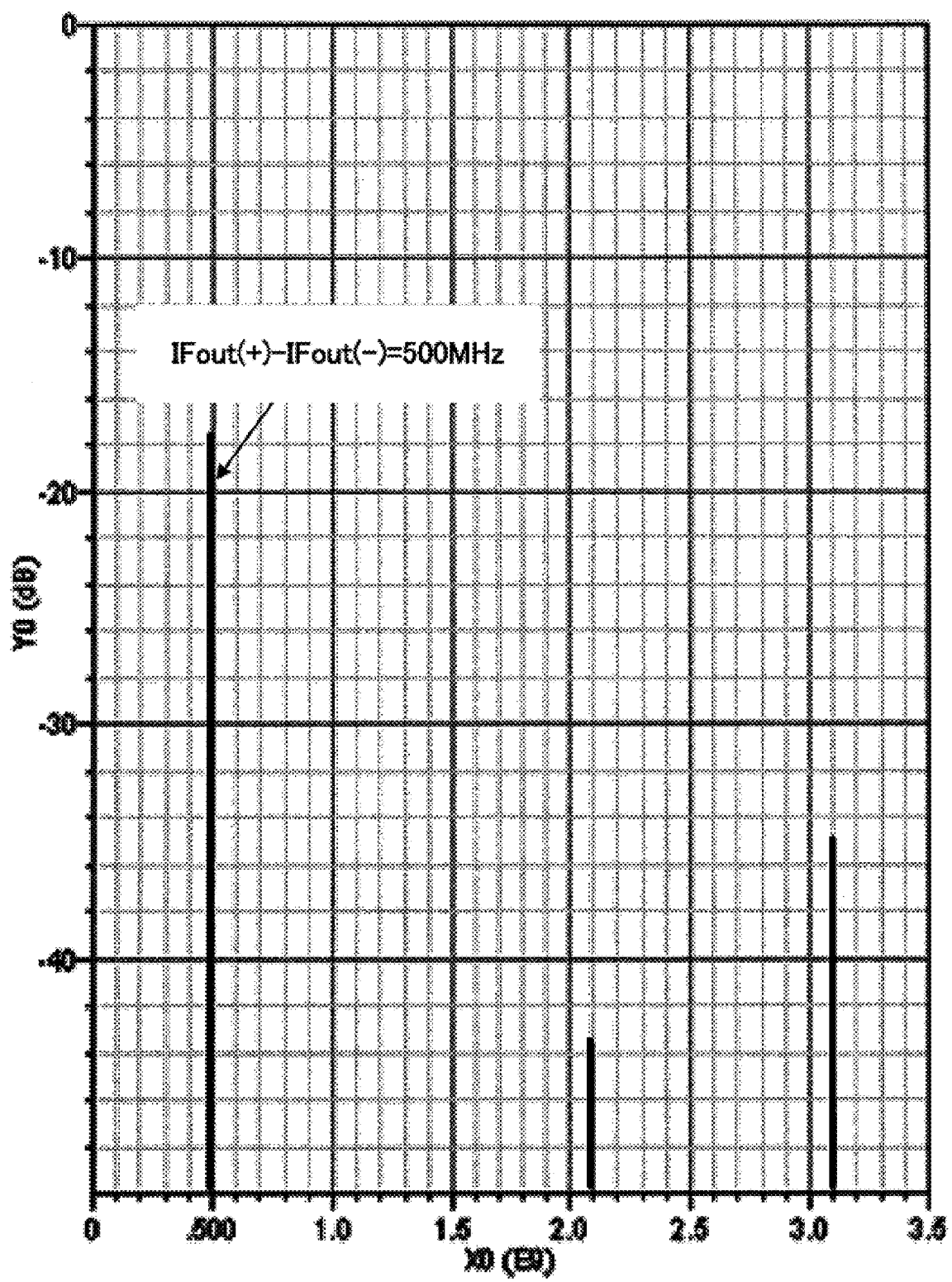
FIG. 12 illustrates a frequency spectrum of the output signal.

Referring now to FIGS. 10 to 12, this section describes results of a simulation performed to examine how the mixer circuit 10 operates. FIG. 10 illustrates an RF input signal and a local signal supplied to the mixer circuit 10. Specifically, the upper half of FIG. 10 illustrates a differential RF input signal, and the lower half illustrates a differential local signal. The vertical axis represents voltage levels while the horizontal axis represents time, graduated in 0.1 ns.

FIG. 11 illustrates output signals of the mixer circuit 10. Specifically, the upper half of FIG. 11 plots two complementary components, IFout(+) and IFout(−), of the differential output signal, and the lower half of FIG. 11 plots their difference (IFout(+)−IFout(−)). The vertical axis represents voltage levels while the horizontal axis represents time, graduated in 1 ns.

FIG. 12 illustrates a frequency spectrum of the output signal. The vertical axis represents voltage levels while the horizontal axis represents frequency.

The mixer circuit 10 receives non-inverted and inverted RF signals with a frequency of 5 GHz at its input terminals RFin(+) and RFin(−), respectively (see upper half of FIG. 10). The mixer circuit 10 also receives non-inverted and inverted local signals with a frequency of 4.5 GHz at its local signal input terminals LOin(+) and LOin(−), respectively (see lower half of FIG. 10).

The resulting non-inverted and inverted output signals appear at the corresponding output terminals IFout(+) and IFout(−). Those output signals have a frequency of 500 MHz, which equals 5 GHz minus 4.5 GHz (see upper half of FIG. 11).

Subtracting the inverted output signal IFout(−) from the non-inverted output signal IFout(+) yields a single-ended output signal (see lower half of FIG. 11). The resulting signal IFout(+)−IFout(−) is then subjected to a spectrum analyzer, or Fourier transform. The frequency spectrum of FIG. 12 indicates a peak frequency component at 500 MHz.

O1CP Performance

Figure 13:
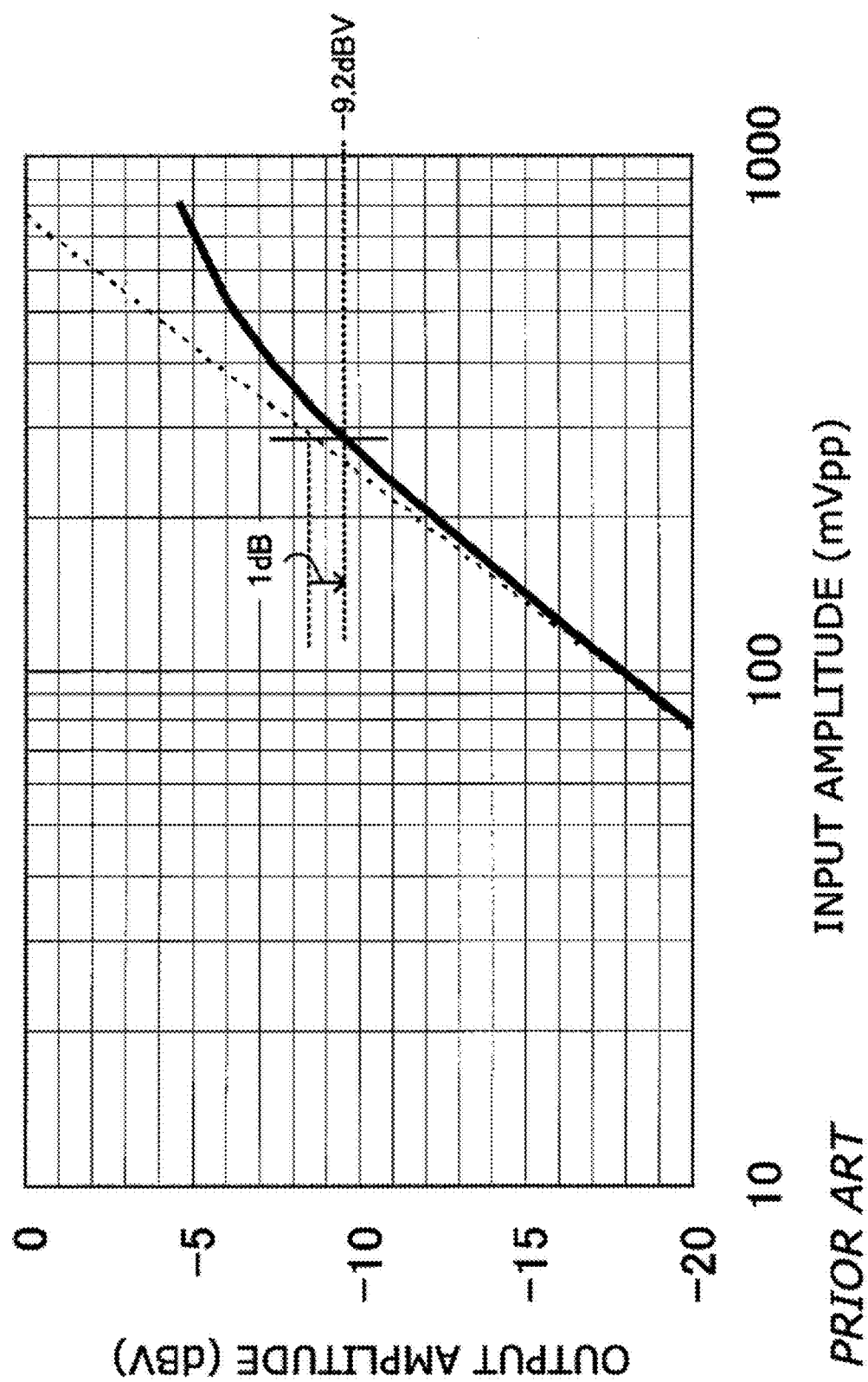
FIGS. 13 and 14 illustrate input/output amplitude characteristics.
Figure 14:
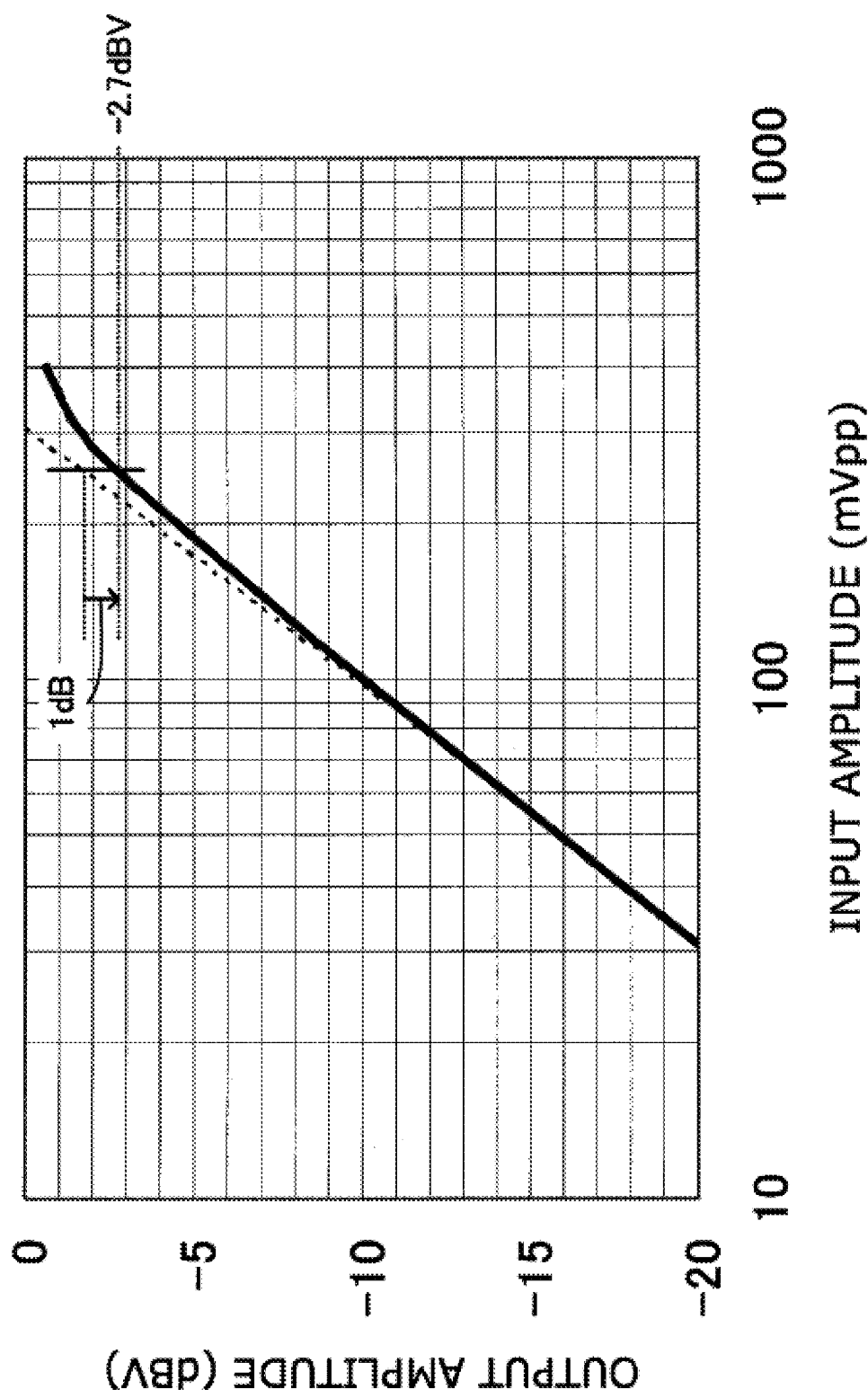

Referring to FIGS. 13 and 14, this section will now described simulation results as to O1CP of the proposed mixer circuit 10, in comparison with the conventional mixer circuit 100. FIGS. 13 and 14 illustrate their input/output curves, where the vertical axis represents output amplitude in dBV, and the horizontal axis represents input amplitude in mVpp.

FIG. 13 illustrates input/output characteristics of the mixer circuit 100 according to conventional technique #1 described earlier, assuming that it operates at a supply voltage of 1.2 V. The oblique dotted line in this graph represents an ideal linear response of the circuit. The actual response of the conventional mixer circuit 100 is plotted with a solid curve, which deviates from the ideal line by −1 dB at the point where the output level is −9.2 dBV. That is, the differential O1CPV (or O1CP in terms of power) is about −9.2 dBV. This logarithmic value is interpreted as 0.69 Vpp (~(−9.2/20)th power of 10).

FIG. 14, on the other hand, illustrates input/output characteristics of the mixer circuit 10 according to the present embodiment, assuming that it operates at a supply voltage of 1.2 V. This graph indicates that the differential O1CPV is around −2.7 dBV, or 1.47 Vpp (~(−2.7/20)th power of 10).

As can be seen from the above results, the proposed mixer circuit 10 offers a higher O1CPV than that of conventional technique #1 (actually two times better). This means that the proposed mixer circuit 10 can provide sufficient linearity even under low supply voltage conditions.

Assuming that transistors M9 to M12 used in the output section require Vds of 400 mV, the differential output voltage developed between the load resistors R5 and R6 is 1.6 Vpp (=(1.2−0.4)×2) theoretically. The simulated output voltage 1.47 Vpp at the O1CPV point is in a good agreement with the theoretical value.

The proposed mixer circuit 10 is designed to achieve its intended functions with single-transistor output sections. This circuit design is advantageous in its sufficient linear range even in the condition of low operating voltage.

The mixer circuit 10 performs mixing operation using rail-to-rail local signals with CMOS voltage levels, as opposed to the narrow-range, intermediate-level local signals used in conventional technique #2 described earlier. This feature of the present embodiment prevents mixing results from being distorted by phase noise or the like, thus enabling accurate mixing operation.

The subsequent sections will present several variations of the above-described mixer circuit 10. All those variations include the function of shifting gate voltage levels of transistors used in the circuit. This feature increases the flexibility of circuit design, as well as providing stable outputs.

First Variation

Figure 15:
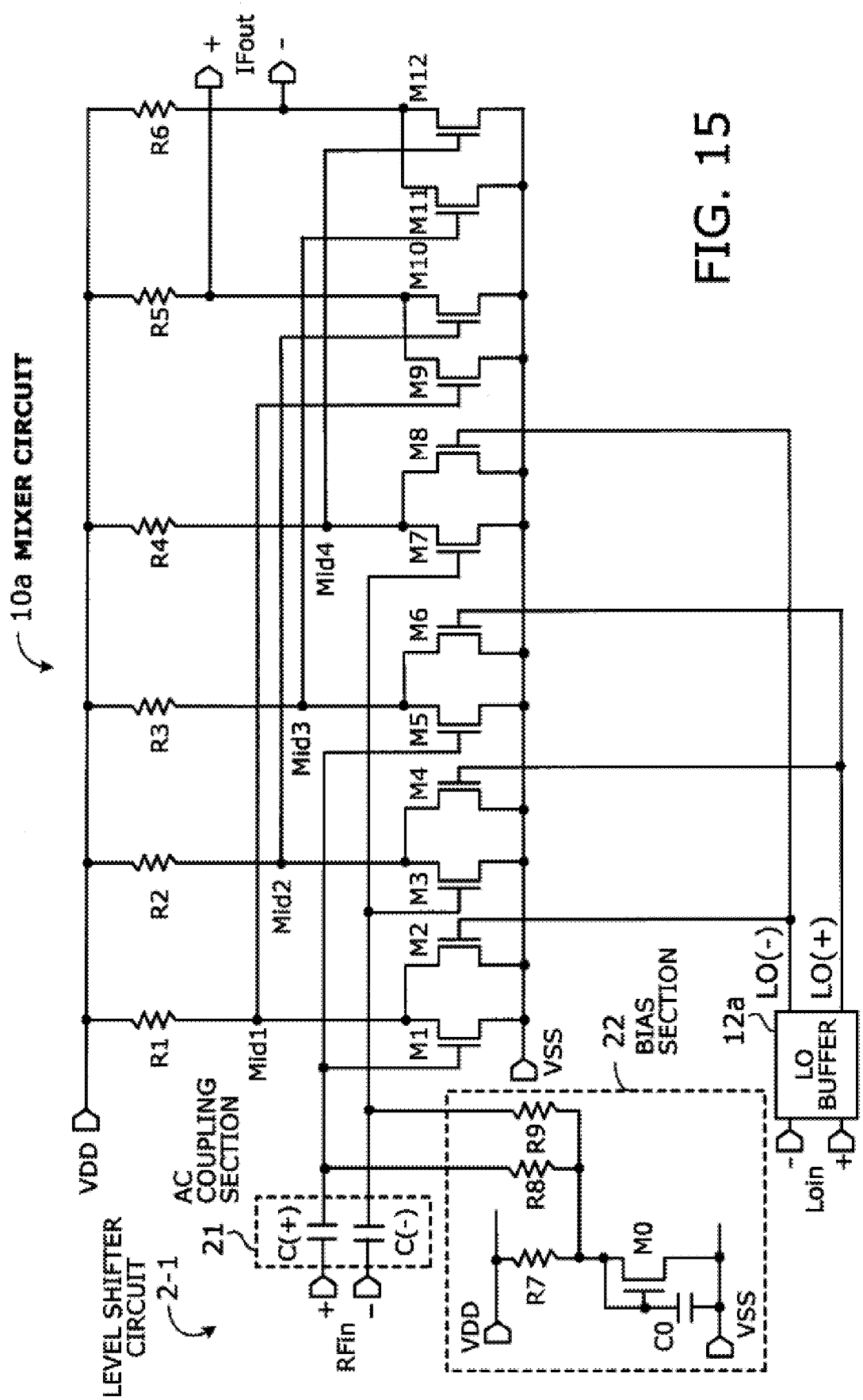
FIG. 15 illustrates a first variation of the proposed mixer circuit.

FIG. 15 illustrates a first variation of the mixer circuit 10. Unlike the original mixer circuit 10, the illustrated mixer circuit 10a has a level shifter circuit 2-1 to shift the DC voltage levels of a differential RF input signal. The other part of the circuit is identical with the original circuit shown in FIG. 2. This section will focus on the difference between the two circuits.

The level shifter circuit 2-1 is formed from an AC coupling section 21 and a bias section 22. The AC coupling section 21 includes a capacitor C(+) placed at the non-inverted RF input and a capacitor C(−) placed at the inverted RF input. The bias section 22 includes resistors R7 to R9, a transistor M0, and a capacitor C0.

One end of capacitor C(+) is connected to non-inverted RF input terminal RFin(+). The other end of capacitor C(+) is connected to the gates of transistors M1 and M5, as well as to one end of resistor R8. Likewise, one end of capacitor C(−) is connected to inverted RF input terminal RFin(−). The other end of capacitor C(−) is connected to the gates of transistors M3 and M7, as well as to one end of resistor R9.

One end of resistor R7 is connected to VDD. The other end of resistor R7 is connected to one end of capacitor C0, the gate and drain of transistor M0, and the other end of resistors R8 and R9. The other end of capacitor C0 is connected to the source of transistor M0, as well as to VSS.

Capacitor C(+) provides AC coupling between input terminal RFin(+) and the gates of transistors M1 and M5, which removes the DC component from the non-inverted RF signal RF(+), so that only the AC components can reach those transistors M1 and M5. Likewise, capacitor C(−) provides AC coupling between input terminal RFin(−) and the gates of transistors M3 and M7, which removes the DC component from the inverted RF signal RF(−), so that only the AC components can reach those transistors M3 and M7.

In the bias section 22, the drain current of transistor M0 produces a voltage signal, or DC bias, across resistor R7. This DC bias voltage is fed to the gates of transistors M1 and M5 via resistor R8, as well as to the gates of transistors M3 and M7 via resistor R9.

As described above, the mixer circuit 10a includes DC blocking capacitors C(+) and C(−) for differential input signals. A bias section 22 is added to the mixer circuit 10a to produce a DC gate bias for transistors M1, M5, M3, and M7. This circuit design offers increased flexibility in setting DC levels of differential input signals.

Second Variation

This section describes a second variation of the mixer circuit 10 according to the present embodiment. As discussed earlier, the DC voltage levels of nodes Mid1 to Mid4 relate to the linear range of transistors M1 to M8. To obtain a wide linear range, those voltages are set to around 800 mV, assuming that the supply voltage is 1.2 V, and that the transistors M1 to M8 require VDS of 400 mV.

On the other hand, transistors with a low threshold voltage (e.g., Vt=100 mV) may be used in the output section (i.e., transistors M9 to M12). The above-mentioned 800-mV gate voltage is too high for such transistors M9 to M12. It could even lead to degradation of those transistors.

One way to solve the above problem is to use transistors with a higher threshold voltage (e.g., Vt=600 mV) for M9 to M12. Other sections of the circuit may use different transistors, such as those with Vt=200 mV. This approach, however, increases the cost of the circuit because it requires integration of different types of transistors in a single circuit block.

The second variation of the embodiment shifts the gate potential of transistors M9 to M12 in the output section to avoid the above difficulties. This approach permits the circuit to use a unified type of transistors, while making it possible to set different gate voltages for different purposes. Specifically, the gates of the output transistors M9 to M12 are controlled such that the common voltage level of output signals, i.e., the average of IF(+) and IF(−), will be 800 mV.

Figure 16:
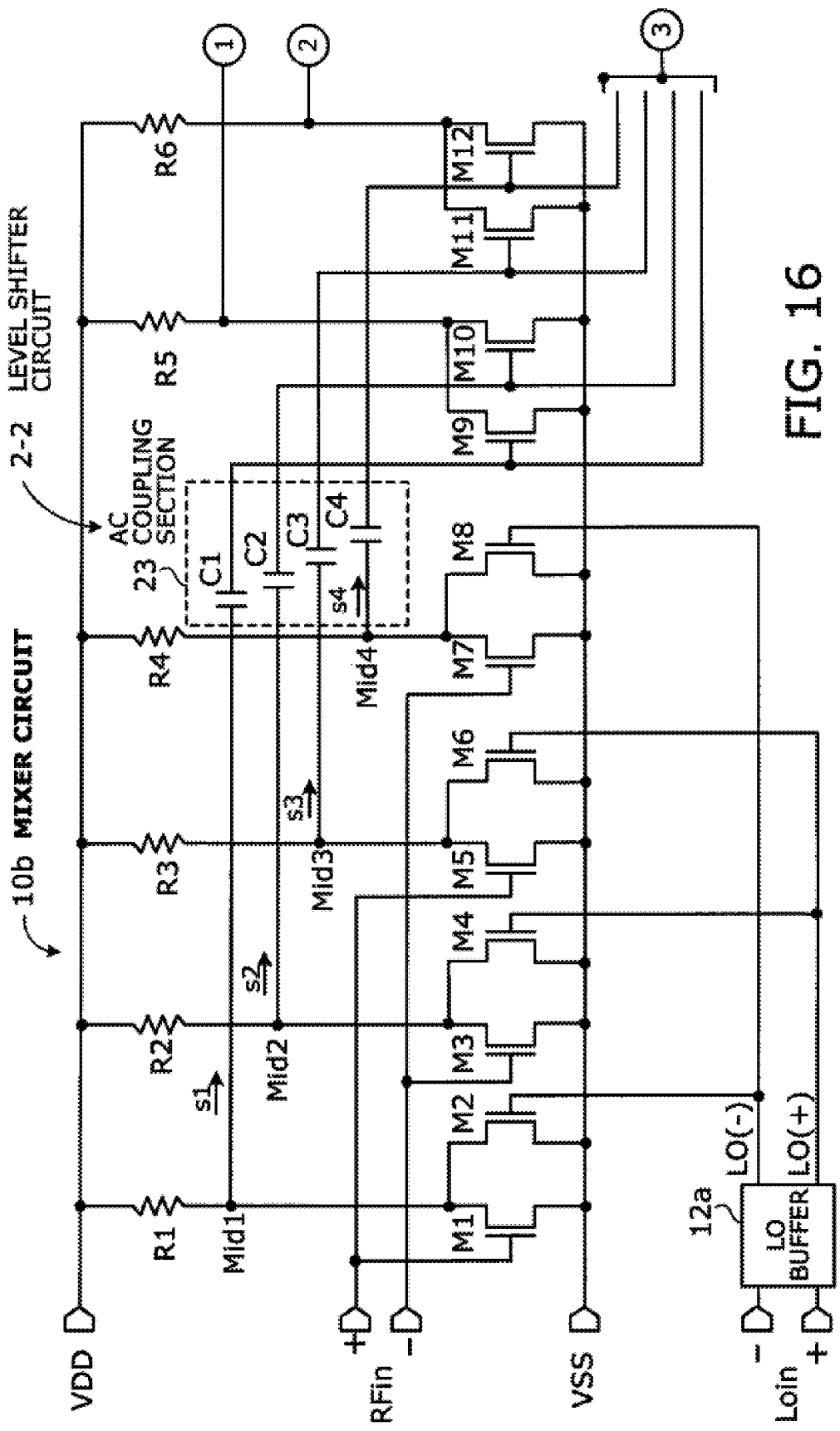
FIGS. 16 and 17 illustrate a second variation of the proposed mixer circuit.
Figure 17:
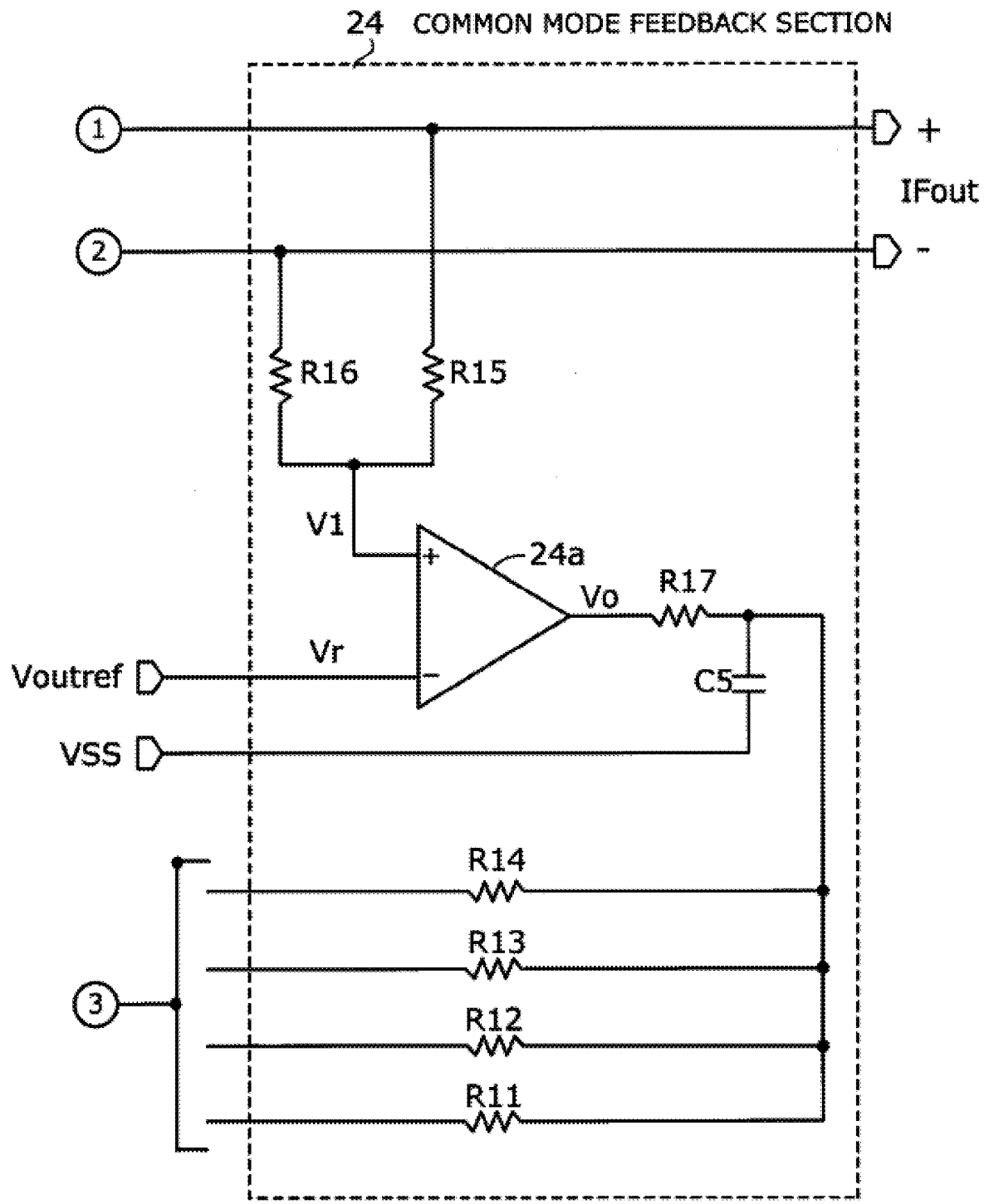

FIGS. 16 and 17 illustrate a mixer circuit according to the second variation. This mixer circuit 10b has a level shifter circuit 2-2 designed to shift the DC levels of signals s1 to s4. The other part of the circuit is identical with the original circuit shown in FIG. 2. This section will focus on the difference between the two circuits.

The level shifter circuit 2-2 is formed from an AC coupling section 23 and a common mode feedback section 24. The AC coupling section 23 includes capacitors C1 to C4. The common mode feedback section 24 is formed from resistors R11 to R17, a capacitor C5, and an operational amplifier 24a.

One end of capacitor C1 is connected to node Mid1. The other end of capacitor C1 is connected to the gate of transistor M9 and one end of resistor R11. One end of capacitor C2 is connected to node Mid2. The other end of capacitor C2 is connected to the gate of transistor M10 and one end of resistor R12. One end of capacitor C3 is connected to node Mid3. The other end of capacitor C3 is connected to the gate of transistor M11 and one end of resistor R13. One end of capacitor C4 is connected to node Mid4. The other end of capacitor C4 is connected to the gate of transistor M12 and one end of resistor R14.

One end of resistor R15 is connected to the other end of resistor R5, the drains of transistors M9 and M10, and output terminal IFout(+). Likewise, one end of resistor R16 is connected to the other end of resistor R6, the drains of transistors M11 and M12, and output terminal IFout(−).

The other end of resistor R15 is connected to the non-inverted input terminal (+) of the operational amplifier 24a, together with the other end of resistor R16. The inverted input terminal (−) of the operational amplifier 24a is connected to reference voltage terminal Voutref. The output terminal of operational amplifier 24a is connected to one end of resistor R17. The other end of resistor R17 is connected to one end of capacitor C5 and the common ends of resistors R11 to R14. The other end of capacitor C5 is connected to VSS.

Capacitor C1 provides AC coupling between node Mid1 and the gate of transistor M9, which removes the DC component from signal s1 at node Mid1, so that only the AC components of signal s1 can reach the transistor M9. Likewise, capacitor C2 provides AC coupling between node Mid2 and the gate of transistor M10, which removes the DC component from signal s2 at node Mid2, so that only the AC components of signal s2 can reach the transistor M10. Capacitor C3 provides AC coupling between node Mid3 and the gate of transistor M11, which removes the DC component from signal s3 at node Mid3, so that only the AC components of signal s3 can reach the transistor M11. Capacitor C4 provides AC coupling between node Mid4 and the gate of transistor M12, which removes the DC component from signal s4 at node Mid4, so that only the AC components of signal s4 can reach the transistor M12.

The common mode feedback section 24, on the other hand, operates as follows. Resistors R15 and R16 act as monitoring resistors for the IF output of the mixer circuit 10b. Specifically, the differential voltage between two complementary output signals IF(+) and IF(−) is divided according to the ratio of R15 and R16, thus detecting their common-mode DC voltage (or average voltage) V1. This V1 is supplied to the non-inverted input terminal (+) of the operational amplifier 24a. The inverted input terminal of the operational amplifier 24a, on the other hand, is supplied with a reference voltage Vr from reference voltage terminal Voutref. Accordingly, the operational amplifier 24a outputs a difference voltage Vo proportional to the difference between the common-mode voltage V1 and reference voltage Vr.

The network of resistor R17 and capacitor C5 serves as a lowpass filter for integrating (or smoothing) the produced difference voltage Vo. The smoothed difference voltage Vo is applied to the gate of transistor M9 through resistor R11, as well as to the gate of transistor M10 through resistor R12. Vo is also applied to the gate of transistor M11 through resistor R13, as well as to the gate of transistor M12 through resistor R14.

In this way, the difference voltage Vo is fed back to the transistors M9 to M12 in the output section. This feedback loop controls the gate voltages of transistors M9 to M12 such that the common-mode voltage V1 will always be equal to the reference voltage Vr. This feature of the second variation contributes to stability of DC voltage levels of the output signals IF(+) and IF(−). For example, when the reference voltage Vr is set to 800 mV, the output signals IF(+) and IF(−) are controlled in such a way that their common voltage level will be 800 mV (i.e., such that the average of the non-inverted and inverted output voltages will be a desired value). This type of feedback control is called common-mode feedback.

Third Variation

This section describes a third variation of the mixer circuit 10 according to the present embodiment. Stated briefly, the third variation uses source followers to shift the DC levels of signals s1 to s4.

Figure 18:
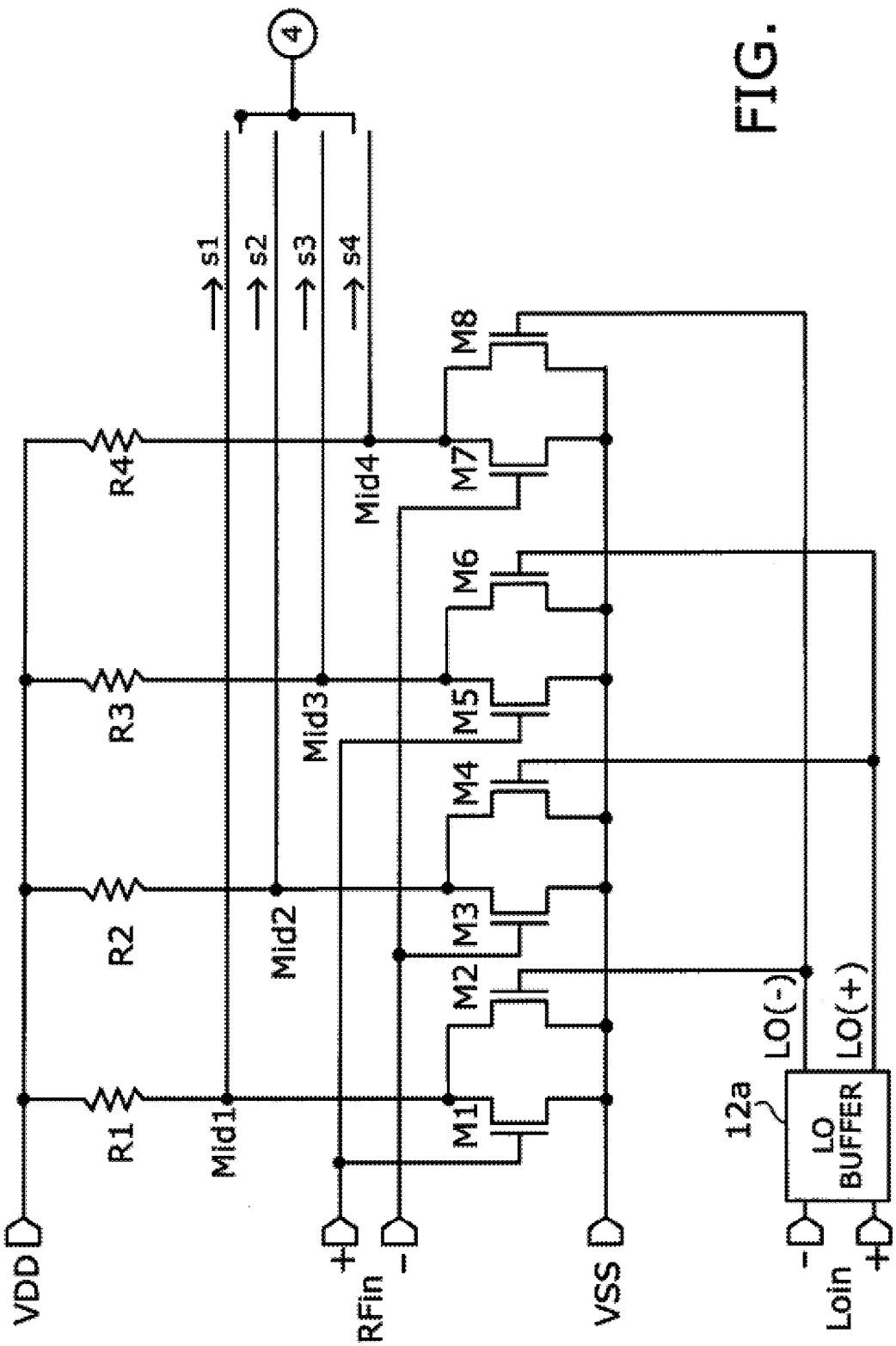
FIGS. 18 and 19 illustrate a third variation of the proposed mixer circuit.
Figure 19:
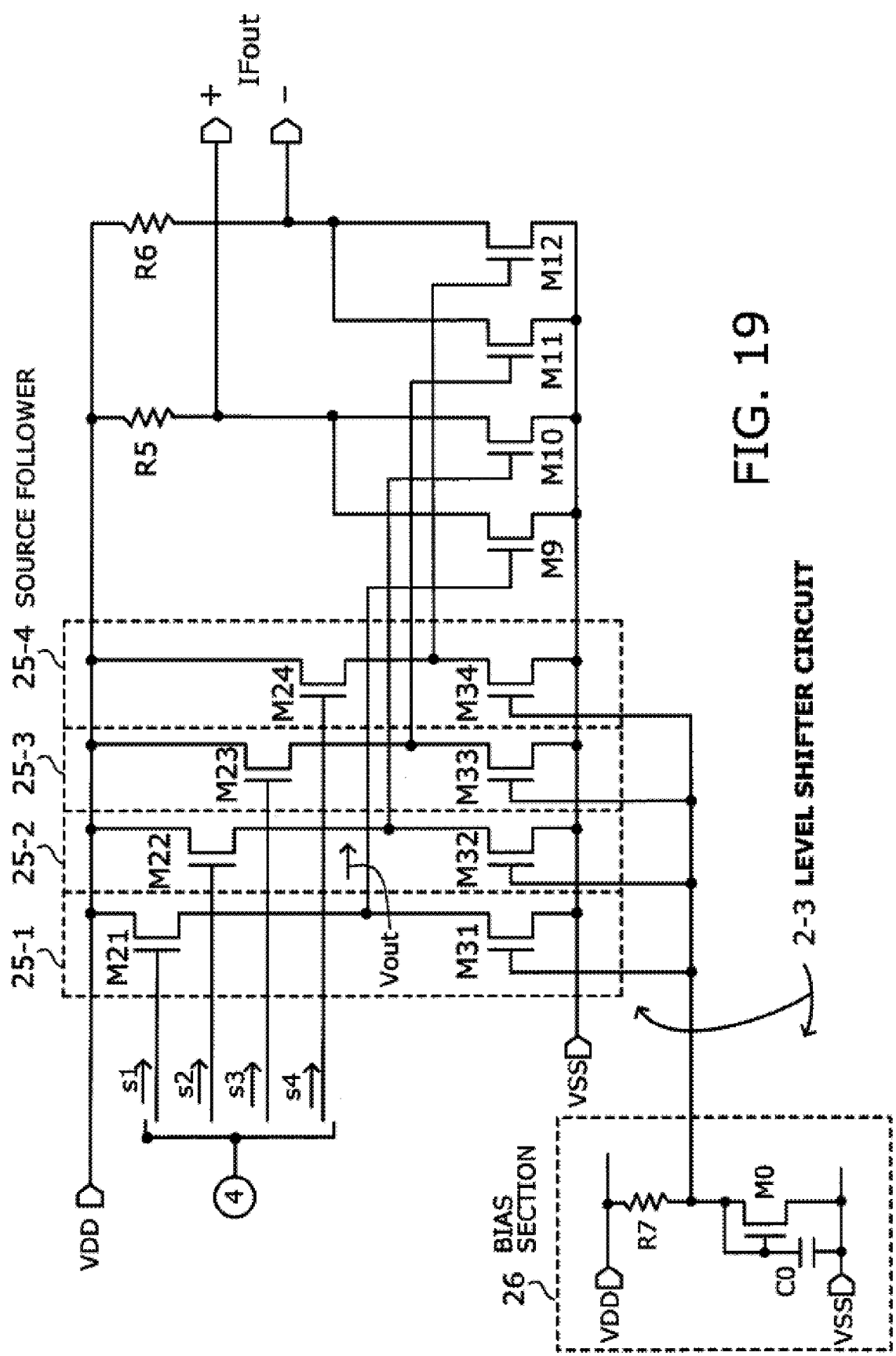

FIGS. 18 and 19 illustrate a mixer circuit 10c according to the third variation. This mixer circuit 10c has a level shifter circuit 2-3 designed to shift the DC levels of signals s1 to s4. The other part of the mixer circuit 10c is identical with the original mixer circuit 10 shown in FIG. 2. This section will focus on the difference between the two circuits.

The level shifter circuit 2-3 is formed from four source followers 25-1 to 25-4 and a bias section 26. The first source follower 25-1 includes a transistor M21 serving as a common-drain amplifier and a transistor M31 serving as a common-source amplifier. The second source follower 25-2 includes a transistor M22 serving as a common-drain amplifier and a transistor M32 serving as a common-source amplifier. The third source follower 25-3 includes a transistor M23 serving as a common-drain amplifier and a transistor M33 serving as a common-source amplifier. The fourth source follower 25-4 includes a transistor M24 serving as a common-drain amplifier and a transistor M34 serving as a common-source amplifier. The bias section 26, on the other hand, is formed from a resistor R7, a transistor M0, and a capacitor C0.

The drain of transistor M21 is connected to VDD. The gate of transistor M21 is connected to node Mid1. The source of transistor M21 is connected to the drain of transistor M31, as well as to the gate of transistor M9. The drain of transistor M22 is connected to VDD. The gate of transistor M22 is connected to node Mid2. The source of transistor M22 is connected to the drain of transistor M32, as well as to the gate of transistor M10. The drain of transistor M23 is connected to VDD. The gate of transistor M23 is connected to node Mid3. The source of transistor M23 is connected to the drain of transistor M33, as well as to the gate of transistor M11. The drain of transistor M24 is connected to VDD. The gate of transistor M24 is connected to node Mid4. The source of transistor M24 is connected to the drain of transistor M34, as well as to the gate of transistor M12.

One end of resistor R7 is connected to VDD. The other end of resistor R7 is connected to one end of the capacitor C0, as well as to the gate and drain of transistor M0. Also connected thereto are the gates of transistors M31 to M34. The other end of capacitor C0 is connected to VSS, as is the source of transistor M0.

Referring to the first source follower 25-1, transistor M31 acts as a current source, which is connected to transistor M21 as its output load. The bias section 26 provides transistor M31 with a DC bias at its gate. Accordingly, a fixed amount of voltage shift (Vshift) occurs at the output Vout of the first source follower 25-1. This output signal Vout is applied to the gate of transistor M9.

The amount of voltage shift is expressed as $$V\text{shift} = V\text{th} + ((2^{1/2} \times I)/\beta)$$

where Vth is the threshold voltage of transistor M21, and I represents the drain current of transistor M21. $\beta$ is a current parameter of transistor M21, which is dependent on the channel length of transistor M21. The output voltage is then expressed as $$V\text{out} = V\text{in} - V\text{shift}$$

where Vin represents the voltage of signal s1. The other source followers 25-2 to 25-4 operate in the same way as the first source follower 25-1.

Another Embodiment

Figure 20:
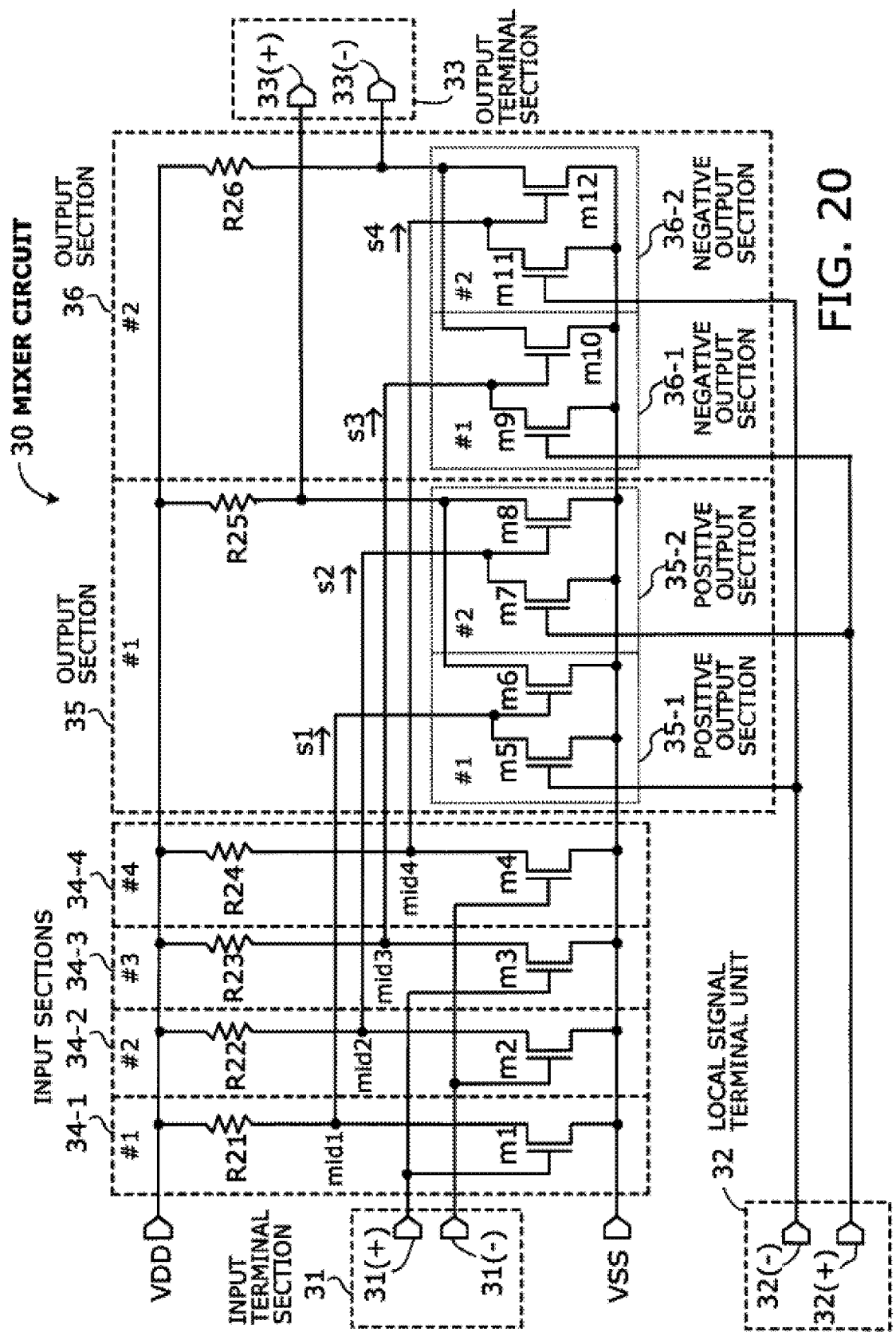
FIG. 20 illustrates a block structure of a mixer circuit according to another embodiment of the present invention.

This section will describe another embodiment of the present invention. FIG. 20 illustrates a block structure of a mixer circuit. The illustrated mixer circuit 30 is formed from an input terminal section 31, a local signal terminal section 32, an output terminal section 33, first to fourth input sections 34-1 to 34-4, a first output section 35, and a second output section 36. All transistors m1 to m12 shown in FIG. 20 are N-channel MOSFETs, arranged as common-source amplifiers.

The input terminal section 31 includes a positive input terminal 31(+) and a negative input terminal 31(−) for receiving positive and negative (or non-inverted and inverted) signals constituting a differential input signal. The local signal terminal section 32 includes a positive local signal terminal 32(+) and a negative local signal terminal 32(−) for receiving a differential local signal. The output terminal section 33 includes a positive output terminal 33(+) and a negative output terminal 33(−) for outputting a differential output signal representing results of mixing operation.

The first input section 34-1 includes a first transistor (transistor m1), whose gate is connected to the positive input terminal 31(+), and whose drain is connected to one end of a first load resistor (resistor R21). The second input section 34-2 includes a second transistor (transistor m2), whose gate is connected to the negative input terminal 31(−), and whose drain is connected to one end of a second load resistor (resistor R22). The third input section 34-3 includes a third transistor (transistor m3), whose gate is connected to the positive input terminal 31(+), and whose drain is connected to one end of a third load resistor (resistor R23). The fourth input section 34-4 includes a fourth transistor (transistor m4), whose gate is connected to the negative input terminal 31(−), and whose drain is connected to one end of a fourth load resistor (resistor R24).

The first output section 35 is formed from a first positive output section 35-1, a second positive output section 35-2, and a fifth load resistor (resistor R25). The first positive output section 35-1 includes a fifth transistor (transistor m5), whose gate is connected to the negative local signal terminal 32(−). Also included in the first positive output section 35-1 is a sixth transistor (transistor m6), whose drain is connected to the positive output terminal 33(+). The drain of transistor m6 is connected to one end of resistor R25. Transistor m5 is driven by an input signal supplied from the negative local signal terminal 32(−), while transistor m6 is driven by signal s1 supplied from the first input section 34-1 via a first node (node mid1). Node mid1 is where the drain of transistor m1 and one end of resistor R21 are connected together.

The second positive output section 35-2 includes a seventh transistor (transistor m7), whose gate is connected to the positive local signal terminal 32(+). Also included in the second positive output section 35-2 is an eighth transistor (transistor m8), whose drain is connected to the positive output terminal 33(+). The drain of this transistor m8 is connected to one end of resistor R25. Transistor m7 is driven by an input signal supplied from the positive local signal terminal 32(+), while transistor m8 is driven by signal s2 supplied from the second input section 34-2 via a second node (node mid2). Node mid2 is where the drain of transistor m2 and one end of resistor R22 are connected together.

The second output section 36 includes a first negative output section 36-1, a second negative output section 36-2, and a sixth load resistor (resistor R26). The first negative output section 36-1 includes a ninth transistor (transistor m9), whose gate is connected to the positive local signal terminal 32(+). Also included in the first negative output section 36-1 is a tenth transistor (transistor m10), whose drain is connected to the negative output terminal 33(−). The drain of this transistor m10 is connected to one end of resistor R26. Transistor m9 is driven by an input signal supplied from the positive local signal terminal 32(+), while transistor m10 is driven by signal s3 supplied from the third input section 34-3 via a third node (node mid3). Node mid3 is where the drain of transistor m3 and one end of resistor R23 are connected together.

The second negative output section 36-2 includes an eleventh transistor (transistor m11), whose gate is connected to the negative local signal terminal 32(−). Also included in the second negative output section 36-2 is a twelfth transistor (transistor m12), whose drain is connected to the negative output terminal 33(−). The drain of this transistor m12 is connected to one end of resistor R26. Transistor m11 is driven by an input signal supplied from the negative local signal terminal 32(−), while transistor m12 is driven by signal s4 supplied from the fourth input section 34-4 via a fourth node (node mid4). Node mid4 is where the drain of transistor m4 and one end of resistor R24 are connected together.

Figure 21:
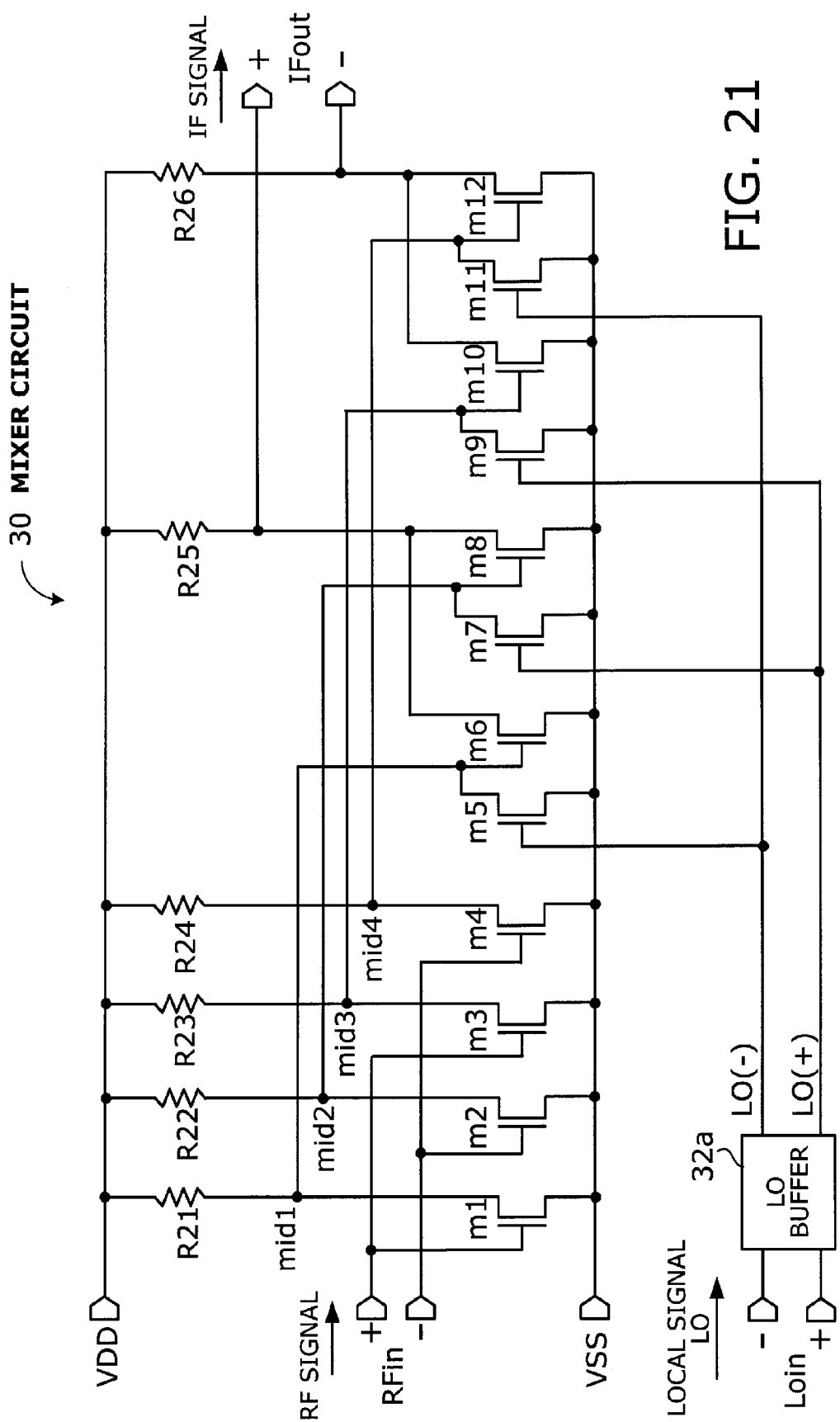
FIG. 21 illustrates a mixer circuit.

Referring now to FIG. 21, the following will now describe in detail the structure and operation of the above mixer circuit 30, which is arranged as follows:

Input terminal RFin(+) is connected to the gates of transistors m1 and m3. Input terminal RFin(−) is connected to the gates of transistors m2 and m4. Local input terminals LOin(−) and LOin(+) are connected to an LO buffer 32a. One output LO(−) of this LO buffer 32a is connected to the gates of transistors m5 and m11, while the other output LO(+) of the same is connected to the gates of transistors m7 and m9.

Power supply voltage VDD is delivered to one end of each resistor R21 to R26. Connected to the ground voltage VSS are the sources of transistors m1 to m12. The other end of resistor R21 is connected to the drains of transistors m1 and m5, as well as to the gate of transistor m6. The other end of resistor R22 is connected to the drains of transistors m2 and m7, as well as to the gate of transistor m8. The other end of resistor R23 is connected to the drains of transistors m3 and m9, as well as to the gate of transistor m10. The other end of resistor R24 is connected to the drains of transistors m4 and m11, as well as to the gate of transistor m12.

The other end of resistor R25 is connected to the drains of transistors m6 and m8, as well as to one output terminal IFout(+). Likewise, the other end of resistor R26 is connected to the drains of transistors m10 and m12, as well as to the other output terminal IFout(−).

Referring now to FIG. 22 and subsequent drawings, the operation of the proposed mixer circuit 30 will be described below. FIG. 22 illustrates various signal propagation paths. Specifically, the mixer circuit 30 provides four paths P1 to P4 to allow signals to propagate from input terminals to output terminals. The following will describe how each path is created.

[Path p1] Non-inverted RF signal RF(+) at input terminal RFin(+) is directed to the gate of transistor m1. Driven by this RF(+) signal, transistor m1 turns on, and the resulting drain current flows through resistor R21, thus producing at node mid1 a voltage proportional to the RF(+) voltage. The produced voltage is applied to the gate of transistor m6, thus turning on transistor m6. The resulting drain current flows through resistor R25, which causes a voltage proportional to the RF(+) voltage to appear at output terminal IFout(−).

[Path p2] Inverted RF signal RF(−) at input terminal RFin(−) is directed to the gate of transistor m4. Driven by this RF(−) signal, transistor m4 turns on, and the resulting drain current flows through resistor R24, thus producing at node mid4 a voltage proportional to the RF(−) voltage. The produced voltage is applied to the gate of transistor m12, thus turning on transistor m12. The resulting drain current flows through resistor R26, which causes a voltage proportional to the RF(−) voltage to appear at output terminal IFout(−).

[Path p3] Inverted RF signal RF(−) at input terminal RFin(−) is directed to the gate of transistor m2. Driven by this RF(−) signal, transistor m2 turns on, and the resulting drain current flows through resistor R22, thus producing at node mid2 a voltage proportional to the RF(−) voltage. The produced voltage is applied to the gate of transistor m8, thus turning on transistor m8. The resulting drain current flows through resistor R25, which causes a voltage proportional to the RF(−) voltage to appear at output terminal IFout(+).

[Path p4] Non-inverted RF signal RF(+) at input terminal RFin(+) is directed to the gate of transistor m3. Driven by this RF(+) signal, transistor m3 turns on, and the resulting drain current flows through resistor R23, thus producing at node mid3 a voltage proportional to the RF(+) voltage. The produced voltage is applied to the gate of transistor m10, thus turning on transistor m10. The resulting drain current flows through resistor R26, which causes a voltage proportional to the RF(+) voltage to appear at output terminal IFout(−).

Mixing of signals is achieved by selecting paths of RF signals according to LO signals. FIG. 23 illustrates how this path selection is made depending on the logic state of the local signal LO. FIGS. 24 to 27 depict each path produced in the circuit, using bold lines for emphasis. The differential local signal LO may be in positive logic state or negative logic state. The following will describe the operation in each case of LO logic state.

(a) Local Signal in Positive Logic State

The positive logic state of local signal LO is represented by LOin(+)=High and LOin(−)=Low. The corresponding outputs of the LO buffer 32a are LO(+)=High and LO(−)=Low in terms of CMOS voltage levels.

Transistor State:

When LO(−)=Low, transistor m5 is turned off, which permits transistor m6 to be turned on according to RFin(+) FIG. 23 represents this state as {m5=OFF, m6=ON[RFin(+)]}. Likewise, transistor m11 is turned off, which permits transistor m12 to be turned on according to RFin(−). FIG. 23 represents this state as {m11=OFF, m12=ON[RFin(−)]}.

When LO(+)=High, transistor m7 is turned on, which effectively turns off transistor m8 coupled thereto. FIG. 23 represents this state as {m7=ON, m8=OFF}. Likewise, transistor m9 is turned on, which effectively turns off transistor m10 coupled thereto. FIG. 23 represents this state as {m9=ON, m10=OFF}.

Figure 24:
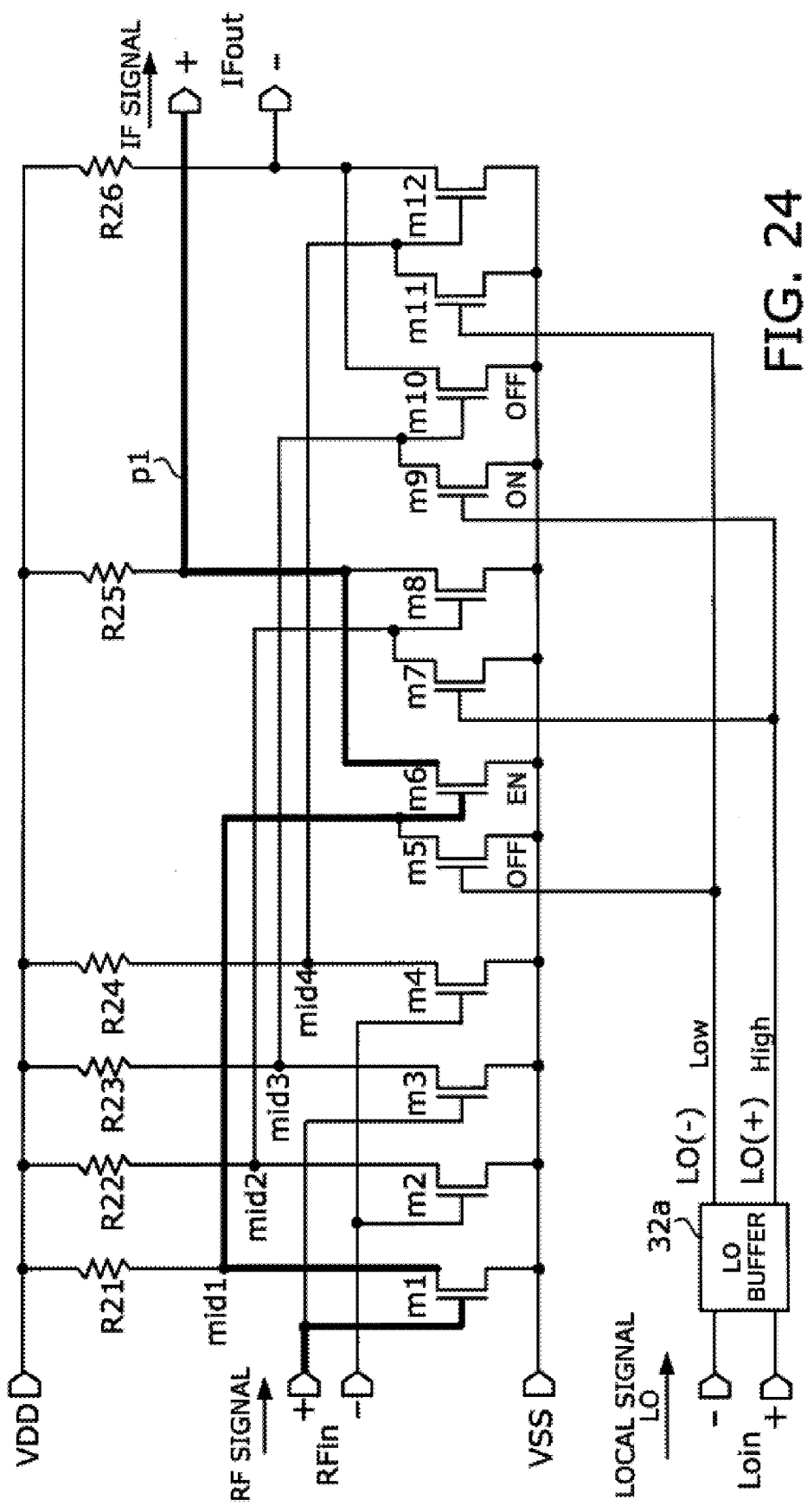
FIGS. 24 to 27 illustrate each signal path produced in the circuit.

Selection of Path p1:

FIG. 24 depicts path p1, which is created when LO(−)=Low and LO(+)=High as shown in section L11 of FIG. 23. LO(−)=Low turns off transistor m5 and thus enables transistor m6 to operate with RFin(+) input. LO(+)=High turns on transistor m9 and, in effect, disables transistor m10. Accordingly, the non-inverted RF signal RF(+) at input terminal RFin(+) propagates through path p1, rather than p4, and thus it reaches output terminal IFout(+). The output voltage in this case is expressed as $$IFout(+) = A_{11} \times RFin(+)$$

where $A_{11} = (gm_{m1} \times R21) \times (gm_{m6} \times R25)$. $gm_{mn}$ represents the mutual conductance of transistor mn (MOSFET), where n=1, 2, ... 12.

Figure 25:
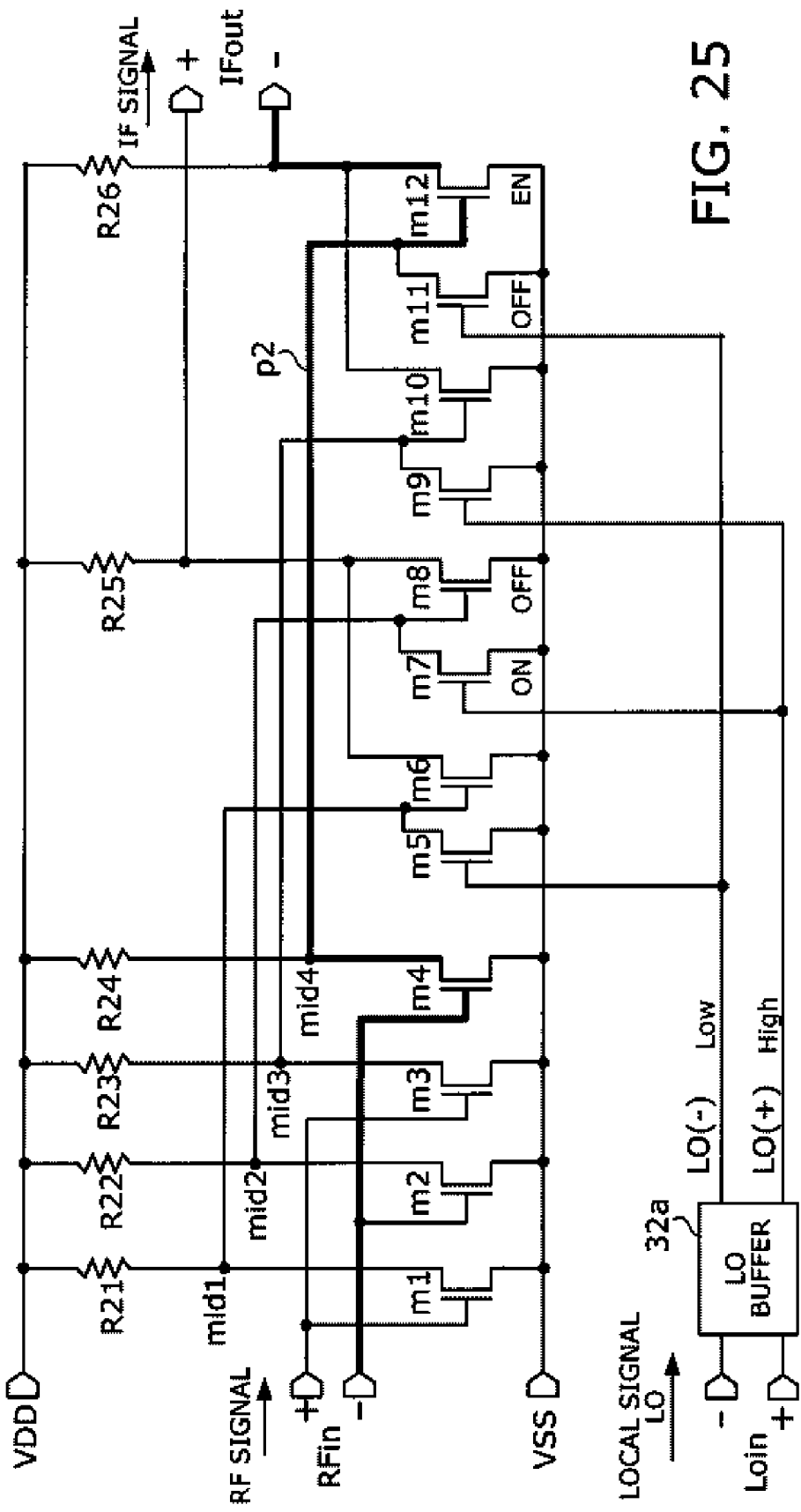

Selection of Path p2:

FIG. 25 depicts path p2, which is created when LO(−)=Low and LO(+)=High as shown in section L12 of FIG. 23. LO(−)=Low turns off transistor m11 and thus enables transistor m12 to operate with RFin(+) input. LO(+)=High turns on transistor m7 and, in effect, disables transistor m8. Accordingly, the inverted RF signal RF(−) at input terminal RFin(−) propagates through path p2, rather than p3, and thus it reaches output terminal IFout(−). The output voltage in this case is expressed as $$IFout(-) = A_{12} \times RFin(-)$$

where $A_{12} = (gm_{m4} \times R24) \times (gm_{m12} \times R26)$.

As described above, when the differential local signal LO is in positive logic state (i.e., LOin(+)=High and LOin(−)=Low), non-inverted RF signal RF(+) propagates from input terminal RFin(+) to output terminal IFout(+), while inverted RF signal RF(−) propagates from input terminal RFin(−) to output terminal IFout(−). This corresponds exactly to what has been described as a general mixing operation in FIG. 3. That is, when the local signal is high, the mixer circuit outputs a non-inverted version of the input signal.

(b) Local Signal in Negative Logic State

The negative logic state of local signal LO is represented by LOin(+)=Low and LOin(−)=High. The corresponding outputs of the LO buffer 32*a* are LO(+)=Low and LO(−)=High in terms of CMOS voltage levels.

Transistor State:

When LO(−)=High, transistor m5 is turned on, which effectively turns off transistor m6 coupled thereto. FIG. 23 represents this state as {m5=ON, m6=OFF}. Likewise, transistor m11 is turned on, which effectively turns off transistor m12 coupled thereto. FIG. 23 represents this state as {m11=ON, m12=OFF}.

When LO(+)=Low, transistor m7 is turned off, which permits transistor m8 to be turned on according to RFin(−) FIG. 23 represents this state as {m7=OFF, m8=ON[RFin(−)]}. Likewise, transistor m9 is turned off, which permits transistor m10 to be turned on according to RFin(+). FIG. 23 represents this state as {m9=OFF, m10=ON[RFin(+)]}.

Figure 26:
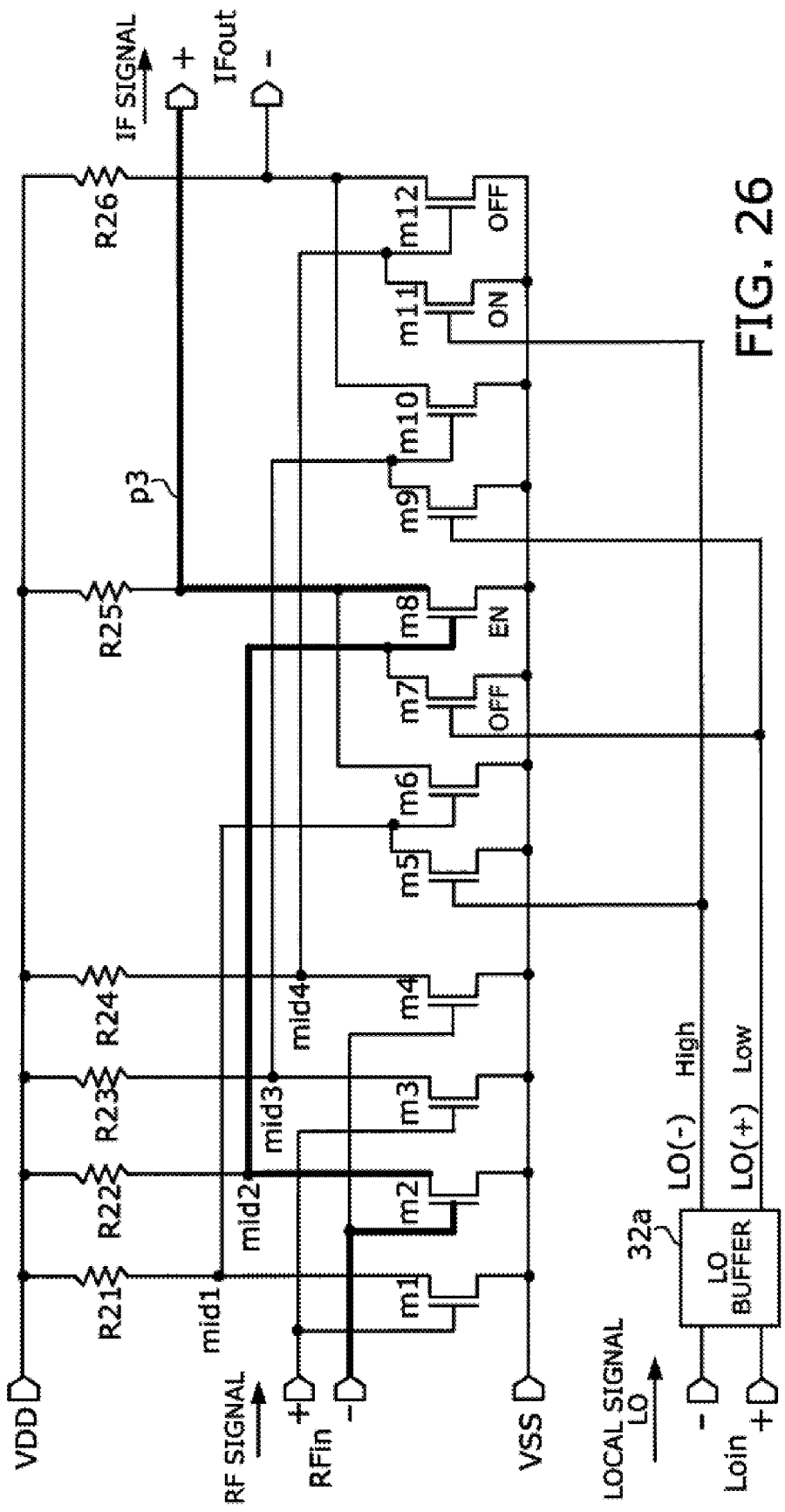

Selection of Path p3:

FIG. 26 depicts path p3, which is created when LO(−)=High and LO(+)=Low as shown in section L13 of FIG. 23. LO(−)=High turns on transistor m11 and, in effect, disables transistor m12. LO(+)=Low turns off transistor m7 and thus enables transistor m8 to operate with RFin(−) input. Accordingly, the inverted RF signal RF(−) at input terminal RFin(−) propagates through path p3, rather than p2, and thus it reaches output terminal IFout(+). The output voltage in this case is expressed as $$IFout(+)=A_{13} \times RFin(-)$$

where $A_{13}=(gm_{m2} \times R22) \times (gm_{m8} \times R25)$

Figure 27:
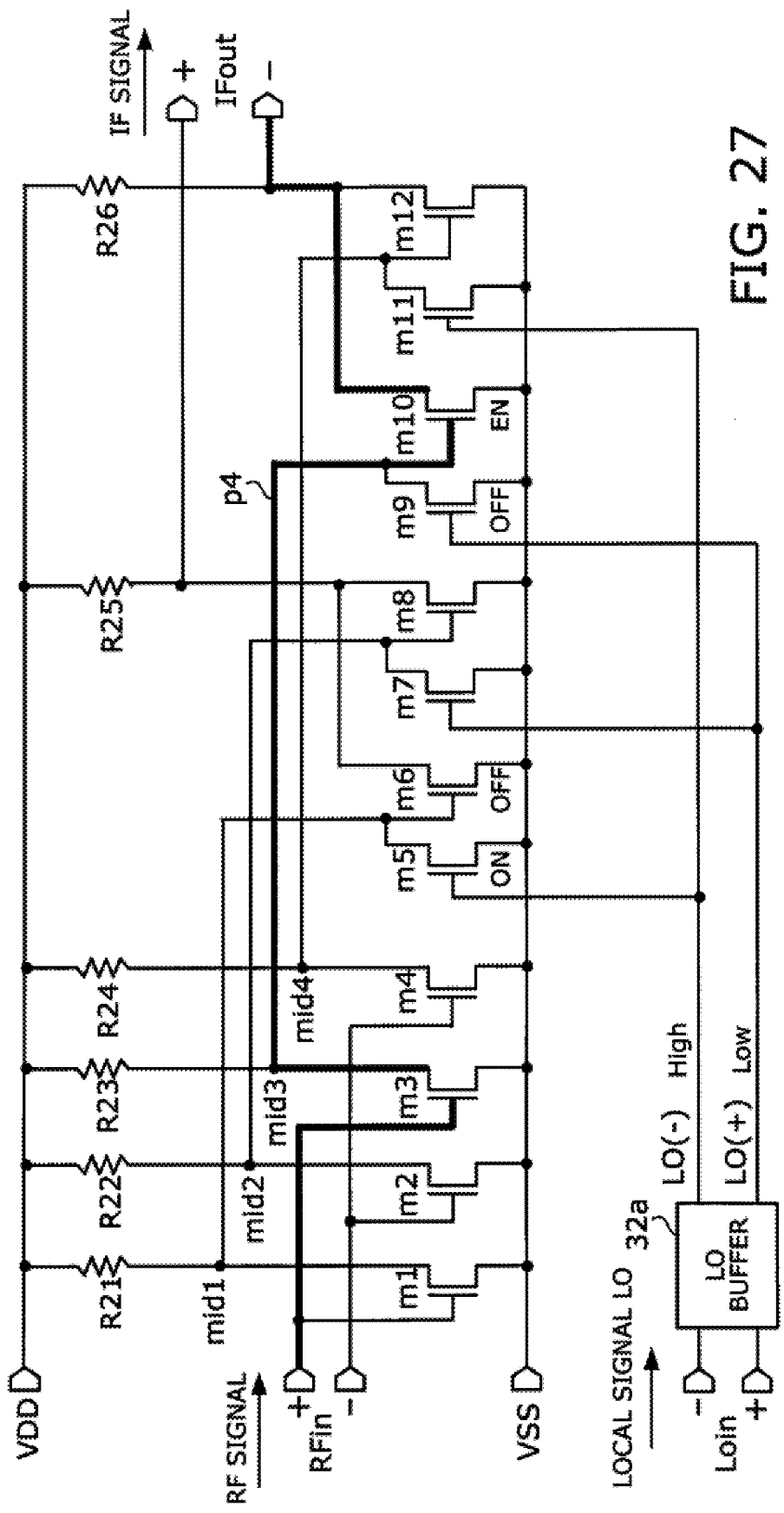

Selection of Path p4:

FIG. 27 depicts path p4, which is created when LO(−)=High and LO(+)=Low as shown in section L14 of FIG. 23. LO(−)=High turns on transistor m5 and, in effect, disables transistor m6. LO(+)=Low turns off transistor m9 and thus enables transistor m10 to operate with RFin(+) input. Accordingly, the non-inverted RF signal RF(+) at input terminal RFin(+) propagates through path p4, rather than p1, and thus it reaches output terminal IFout(−). The output voltage in this case is expressed as $$IFout(-)=A_{14} \times RFin(+)$$

where $A_{14}=(gm_{m3} \times R23) \times (gm_{m10} \times R26)$.

As described above, when the differential local signal LO is in negative logic state (i.e., LOin(+)=Low and LOin(−)=High), the non-inverted RF signal RF(+) propagates from input terminal RFin(+) to output terminal IFout(−), while the inverted RF signal RF(−) propagates from input terminal RFin(−) to output terminal IFout(+). This corresponds exactly to what has been described as a general mixing operation in FIG. 3. That is, when the local signal is low, the mixer circuit outputs an inverted version of the input signal.

Other Variations of Mixer Circuit

Figure 28:
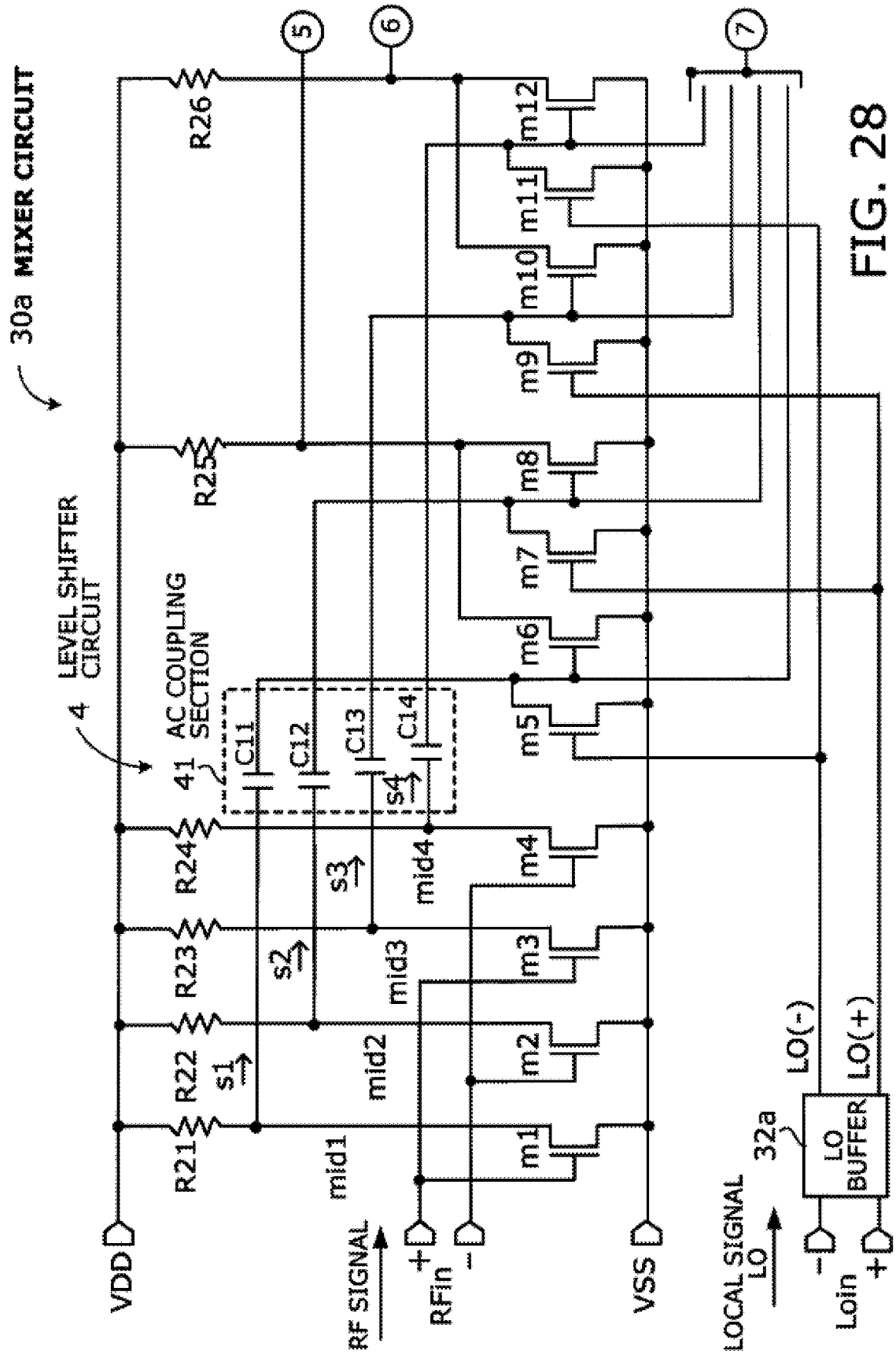
FIGS. 28 and 29 illustrate a variation of the proposed mixer circuit.
Figure 29:
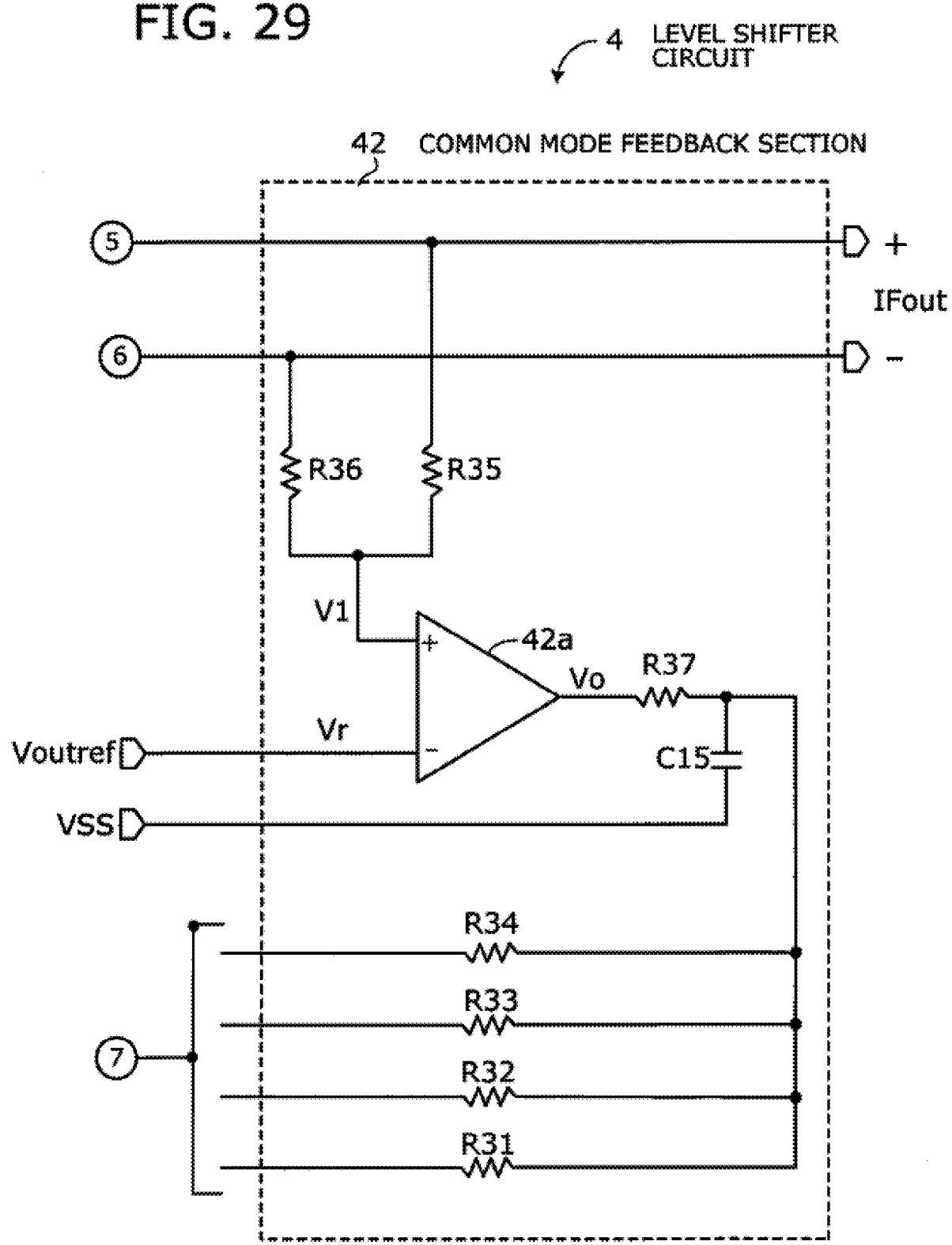
Figure 30:
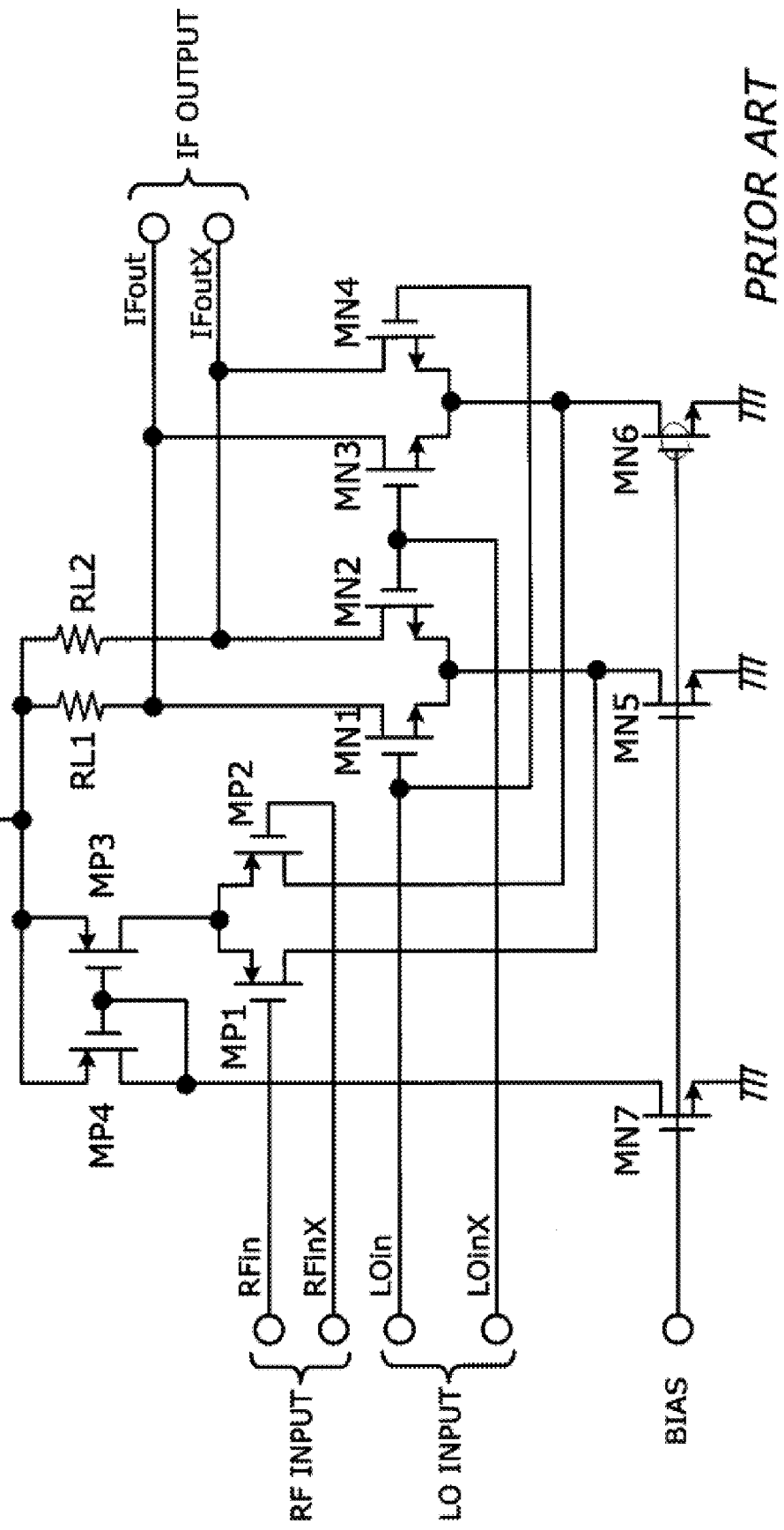
FIG. 30 illustrates a structure of a conventional mixer circuit.
Figure 31:
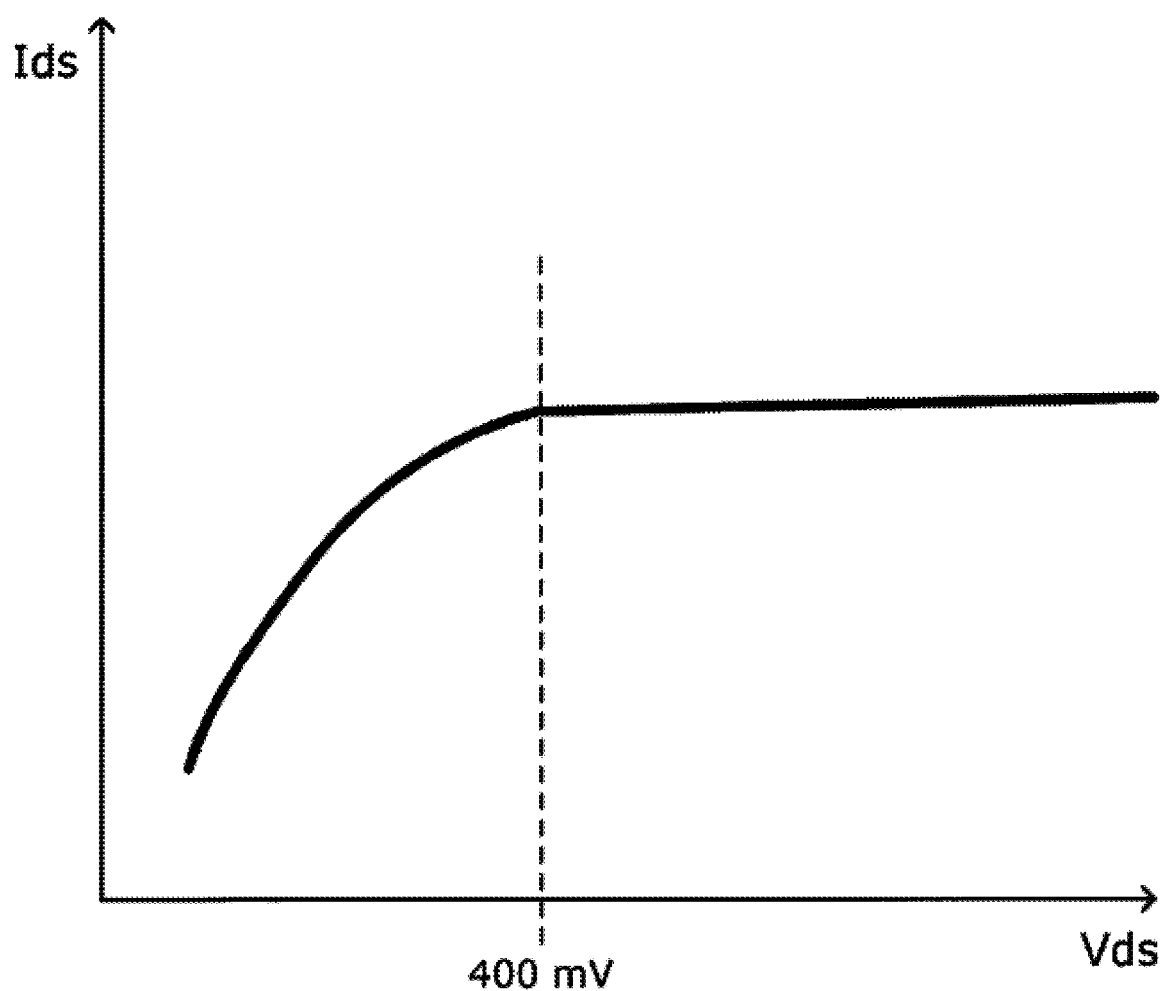
FIG. 31 illustrates an example of Ids-Vds characteristics.
Figure 32:
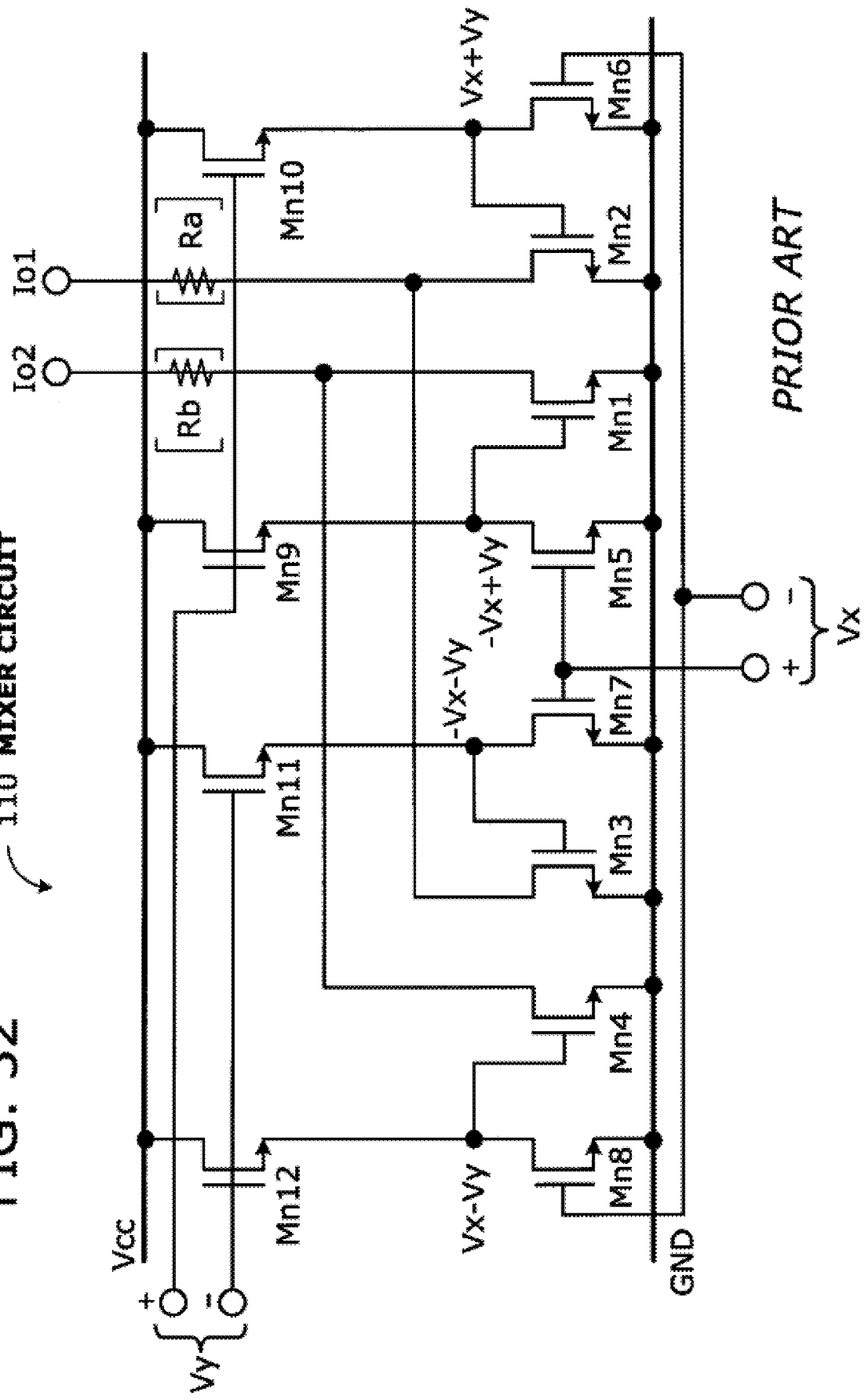
FIG. 32 illustrates a structure of another conventional mixer circuit.

Referring now to FIGS. 28 and 29, a variation of the proposed mixer circuit 30 will be described below. This mixer circuit 30*a* differs from the original mixer circuit 30 in that it has a level shifter circuit 4 designed to shift the voltage levels of signals s1 to s4. The other part of the mixer circuit 30*a* is identical with the original mixer circuit 30 shown in FIG. 21. This section will focus on the difference between the two circuits.

The level shifter circuit 4 is formed from an AC coupling section 41, and a common mode feedback section 42. The AC coupling section 41 includes four capacitors C11 to C14. The common mode feedback section 42 is formed from seven resistors R31 to R37, a capacitor C15, and an operational amplifier 42*a*.

One end of capacitor C11 is connected to node mid1. The other end of capacitor C11 is connected to the drain of transistor m5 and the gate of transistor m6, as well as to one end of resistor R31. One end of capacitor C12 is connected to node mid2. The other end of capacitor C12 is connected to the drain of transistor m7 and the gate of transistor m8, as well as to one end of resistor R32. One end of capacitor C13 is connected to node mid3. The other end of capacitor C13 is connected to the drain of transistor m9 and the gate of transistor m10, as well as to one end of resistor R33. One end of capacitor C14 is connected to node mid4. The other end of capacitor C14 is connected to the drain of transistor m11 and the gate of transistor m12, as well as to one end of resistor R34.

One end of resistor R35 is connected to the other end of resistor R25 and the drains of transistors m6 and m8, as well as to one output terminal IFout(+). Likewise, one end of resistor R36 is connected to the other end of resistor R26 and the drains of transistors m10 and m12, as well as to the other output terminal IFout(−).

The other end of resistor R35 is connected to the non-inverted input terminal (+) of the operational amplifier 42*a*, together with the other end of resistor R36. The inverted input terminal (−) of the operational amplifier 42*a* is connected to reference voltage terminal Voutref. The output terminal of operational amplifier 42*a* is connected to one end of resistor R37. The other end of resistor R37 is connected to one end of capacitor C15 and the other end of each resistor R31 to R34. The other end of capacitor C15 is connected to VSS. The level shifter circuit 4 operates in the same way as the level shifter circuit 2-2 discussed in FIGS. 16 and 17. The explanation will not be repeated here.

The mixer circuit 30 of FIG. 21 may also be modified with other types of level shifter circuit, rather than the one using common-mode feedback, to control gate voltages of output transistors. For example, the source followers discussed in FIGS. 19 and 20 may be incorporated into the mixer circuit 30. It is also possible to modify the input sections to implement level shift functions as in the circuit illustrated in FIG. 15.

Transistor Types

While the foregoing embodiments and their variations use N-channel MOSFETs, the present invention is not limited to any type of transistors. For example, the present invention may be implemented by using P-channel MOSFETs. If this is the case, the polarity of voltages applied to the gates and drains of those MOSFETs is reversed.

CONCLUSION

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A mixer circuit for mixing signals, comprising:
   (a) an input terminal section comprising positive and negative input terminals for respectively receiving positive and negative input signals that constitute a differential input signal;
   (b) a local signal terminal section comprising positive and negative local signal terminals for receiving a differential local signal;
   (c) an output terminal section comprising positive and negative output terminals for outputting a differential output signal representing results of mixing the differential input signal and the differential local signal;
   (d) a first input section comprising:
   a first transistor whose gate is coupled to the positive input terminal,
   a second transistor whose gate is coupled to the negative local signal terminal, and
   a first load resistor connected to a first node at which drains of the first and second transistors are connected together;
   (e) a second input section comprising:
   a third transistor whose gate is coupled to the negative input terminal,
   a fourth transistor whose gate is coupled to the positive local signal terminal, and
   a second load resistor connected to a second node at which drains of the third and fourth transistors are connected together;
   (f) a third input section comprising:
   a fifth transistor whose gate is coupled to the positive input terminal,
   a sixth transistor whose gate is coupled to the positive local signal terminal, and
   a third load resistor connected to a third node at which drains of the fifth and sixth transistors are connected together;
   (g) a fourth input section comprising:
   a seventh transistor whose gate is coupled to the negative input terminal,
   an eighth transistor whose gate is coupled to the negative local signal terminal, and
   a fourth load resistor connected to a fourth node at which drains of the seventh and eighth transistors are connected together;
   (h) a positive output section comprising:
   a ninth transistor whose drain is connected to the positive output terminal,
   a tenth transistor whose drain is connected to the positive output terminal, and
   a fifth load resistor connected to a fifth node at which the drains of the ninth and tenth transistors are connected together,
   wherein the ninth transistor is driven by a first signal supplied from the first input section via the first node, and
   wherein the tenth transistor is driven by a second signal supplied from the second input section via the second node; and
   (i) a negative output section comprising:
   an eleventh transistor whose drain is connected to the negative output terminal,
   a twelfth transistor whose drain is connected to the negative output terminal, and
   a sixth load resistor connected to a sixth node at which the drains of the eleventh and twelfth transistors are connected together,
   wherein the eleventh transistor is driven by a third signal supplied from the third input section via the third node, and
   wherein the twelfth transistor is driven by a fourth signal supplied from the fourth input section via the fourth node.

2. The mixer circuit according to claim 1, wherein:
   a gate of the ninth transistor is connected to the first node;
   a gate of the tenth transistor is connected to the second node;
   a gate of the eleventh transistor is connected to the third node; and
   a gate of the twelfth transistor is connected to the fourth node.

3. The mixer circuit according to claim 1, further comprising:
   (a) a first path from the positive input terminal to the positive output terminal and a second path from the negative input terminal to the negative output terminal which are selected to effect mixing of the differential input signal and the differential local signal, when the differential local signal is in positive logic state, and when the positive local signal terminal is driven to a high level, and when the negative local signal terminal is driven to a low level,
   wherein the first path is created by turning on the sixth transistor to effectively disable the fifth transistor and turning off the second transistor to enable the first signal to be supplied from the first transistor to a gate of the ninth transistor, and
   wherein the second path is created by turning on the fourth transistor to effectively disable the third transistor and turning off the eighth transistor to enable the fourth signal to be supplied from the seventh transistor to a gate of the twelfth transistor; and
   (b) a third path from the negative input terminal to the positive output terminal and a fourth path from the positive input terminal to the negative output terminal to effect mixing of the differential input signal and the differential local signal, when the differential local signal is in negative logic state, and when the positive local signal terminal is driven to a low level, and when the negative local signal terminal is driven to a high level,
   wherein the third path is created by turning on the eighth transistor to effectively disable the seventh transistor and turning off the fourth transistor to enable the second signal to be supplied from the third transistor to a gate of the tenth transistor, and
   wherein the fourth path is created by turning on the second transistor to effectively disable the first transistor and turning off the sixth transistor to enable the third signal to be supplied from the fifth transistor to a gate of the eleventh transistor.

4. The mixer circuit according to claim 2, wherein:
   (a) the first path comprises transfer characteristics expressed as:

$IFout(+) = A_1 \times RFin(+)$ $A_1 = (gm_{m1} \times R1) \times (gm_{m9} \times R5)$ (b) the second path comprises transfer characteristics expressed as:

$IFout(-) = A_2 \times RFin(-)$ $A_2 = (gm_{m7} \times R4) \times (gm_{m12} \times R6)$ (c) the third path comprises transfer characteristics expressed as:

$$IFout(+) = A_3 \times RFin(-)$$

$$A_3 = (gm_{m3} \times R2) \times (gm_{m10} \times R5)$$

(d) the fourth path comprises transfer characteristics expressed as:

$$IFout(-) = A_4 \times RFin(+)$$

$$A_4 = (gm_{m5} \times R3) \times (gm_{m11} \times R6)$$

where $A_1$ to $A_4$ represent gains of signals propagating through the first to fourth paths, respectively, each gm represents a variation of the drain current with a small change in gate voltage, RFin(+) represents a voltage level of the positive input signal at the positive input terminal, RFin(−) represents a voltage level of the negative input signal at the negative input terminal, IFout(+) represents a voltage level of an output signal at the positive output terminal, IFout(−) represents a voltage level of an output signal at the negative output terminal, R1 to R6 represent resistance of the first to sixth load resistors, and $gm_{MN}$ represent mutual conductance of the Nth transistor where N=1, 2,...12.

5. The mixer circuit according to claim 1, wherein:

the tenth transistor comprises a threshold voltage higher than a gate voltage determined by a ratio between on-resistance of the fourth transistor and resistance of the second resistor, whereby an on state of the fourth transistor prevents the tenth transistor from turning on;

the eleventh transistor comprises a threshold voltage higher than a gate voltage determined by a ratio between on-resistance of the sixth transistor and resistance of the third resistor, whereby an on state of the sixth transistor prevents the eleventh transistor from turning on;

the ninth transistor comprises a threshold voltage higher than a gate voltage determined by a ratio between on-resistance of the second transistor and resistance of the first resistor, whereby an on state of the second transistor prevents the ninth transistor from turning on; and the twelfth transistor comprises a threshold voltage higher than a gate voltage determined by a ratio between on-resistance of the eighth transistor and resistance of the fourth resistor, whereby an on state of the eighth transistor prevents the twelfth transistor from turning on.

6. The mixer circuit according to claim 1, further comprising a level shifter circuit for shifting voltage levels of the differential input signal, the level shifter circuit comprising:

an AC coupling section comprising a first capacitor placed between the positive input terminal and the gates of the first and fifth transistors and a second capacitor placed between the negative input terminal and the gates of the third and seventh transistors; and a bias section, coupled to the AC coupling section, for providing bias voltages to the gates of the first, third, fifth, and seventh transistors.

7. The mixer circuit according to claim 1, further comprising a level shifter circuit for shifting voltage levels of the first to fourth signals, the level shifter circuit comprising:

(a) an AC coupling section comprising:

a first capacitor placed between the first node and a gate of the ninth transistor, a second capacitor placed between the second node and a gate of the tenth transistor, a third capacitor placed between the third node and a gate of the eleventh transistor, and a fourth capacitor placed between the fourth node and a gate of the twelfth transistor; and (b) a common mode feedback section that produces a divided voltage from a voltage between the positive and negative output terminals and controls a voltage signal applied to gates of the ninth to twelfth transistors such that the divided voltage will be equal to a specified reference voltage.

8. The mixer circuit according to claim 1, further comprising a level shifter circuit for shifting voltage levels of the first to fourth signals, the level shifter circuit comprising:

(a) a first source follower comprising:

a first common-drain transistor serving as a common-drain amplifier, whose gate is connected to the first node, and a first common-source transistor serving as a common-source amplifier, whose drain is connected to a source of the first common-drain transistor, as well as to a gate of the ninth transistor in the positive output section;

(b) a second source follower comprising:

a second common-drain transistor serving as a common-drain amplifier, whose gate is connected to the second node, and a second common-source transistor serving as a common-source amplifier, whose drain is connected to a source of the second common-drain transistor, as well as to a gate of the tenth transistor in the positive output section;

(c) a third source follower comprising:

a third common-drain transistor serving as a common-drain amplifier, whose gate is connected to the third node, and a third common-source transistor serving as a common-source amplifier, whose drain is connected to a source of the third common-drain transistor, as well as to a gate of the eleventh transistor in the negative output section;

(d) a fourth source follower comprising:

a fourth common-drain transistor serving as a common-drain amplifier, whose gate is connected to the fourth node, and a fourth common-source transistor serving as a common-source amplifier, whose drain is connected to a source of the fourth common-drain transistor, as well as to a gate of the twelfth transistor in the negative output section; and (e) a bias section applying a bias voltage to the first to gates of fourth common-source transistors.

9. A mixer circuit for mixing signals, comprising:

(a) an input terminal section comprising positive and negative input terminals for respectively receiving positive and negative input signals that constitute a differential input signal;

(b) a local signal terminal section comprising positive and negative local signal terminals for receiving a differential local signal;

(c) an output terminal section comprising positive and negative output terminals for outputting a differential output signal representing results of mixing the differential input signal and the differential local signal;

(d) a first input section comprising:

a first load resistor, and a first transistor whose gate is coupled to the positive input terminal, and whose drain is connected to one end of the first load resistor are connected together at a first node;

(e) a second input section comprising:
a second load resistor, and
a second transistor whose gate is coupled to the negative input terminal, and whose drain is connected to one end of the second load resistor are connected together at a second node;

(f) a third input section comprising:
a third load resistor, and
a third transistor whose gate is coupled to the positive input terminal, and whose drain is connected to one end of the third load resistor are connected together at a third node;

(g) a fourth input section comprising:
a fourth load resistor, and
a fourth transistor whose gate is coupled to the negative input terminal, and whose drain is connected to one end of the fourth load resistor are connected together at a fourth node;

(h) a first output section comprising:
(h1) a fifth load resistor connected to the positive output terminal,
(h2) a first positive output section comprising:
a fifth transistor whose gate is coupled to the negative local signal terminal, and
a sixth transistor whose drain is connected to the fifth load resistor, and whose gate is driven by a first signal supplied from the first input section, and
(h3) a second positive output section comprising:
a seventh transistor whose gate is coupled to the positive local signal terminal, and
an eighth transistor whose drain is connected to the fifth load resistor, and whose gate is driven by a second signal supplied from the second input section; and (i) a second output section comprising:
(i1) a sixth load resistor connected to the negative output terminal,
(i2) a first negative output section comprising:
a ninth transistor whose gate is coupled to the positive local signal terminal, and
a tenth transistor whose drain is connected to the fifth load resistor, and whose gate is driven by a third signal supplied from the third input section, and
(i3) a second negative output section comprising:
an eleventh transistor whose gate is coupled to the negative local signal terminal, and
a twelfth transistor whose drain is connected to the sixth load resistor, and whose gate is driven by a fourth signal supplied from the fourth input section.

10. The mixer circuit according to claim 9, wherein:
a drain of the fifth transistor and the gate of the sixth transistor are connected to the first node at which the drain of the first transistor and the first load resistor are connected together;
a drain of the seventh transistor and the gate of the eighth transistor are connected to the second node at which the drain of the second transistor and the second load resistor are connected together;
a drain of the ninth transistor and the gate of the tenth transistor are connected to the third node at which the drain of the third transistor and the third load resistor are connected together; and
a drain of the eleventh transistor and the gate of the twelfth transistor are connected to the fourth node at which the drain of the fourth transistor and the fourth load resistor are connected together.

11. The mixer circuit according to claim 9, further comprising:
(a) a first path from the positive input terminal to the positive output terminal and a second path from the negative input terminal to the negative output terminal which are selected to effect mixing of the differential input signal and the differential local signal, when the differential local signal is in positive logic state, and when the positive local signal terminal is driven to a high level, and when the negative local signal terminal is driven to a low level,
wherein the first path is created by turning on the ninth transistor to turn off the tenth transistor and turning off the fifth transistor to enable the sixth transistor to operate with the first signal produced by the first transistor, and
wherein the second path is created by turning on the seventh transistor to turn off the eighth transistor and turning off the eleventh transistor to enable the twelfth transistor to operate with the fourth signal produced by the fourth transistor;
(b) a third path from the negative input terminal to the positive output terminal and a fourth path from the positive input terminal to the negative output terminal to effect mixing of the differential input signal and the differential local signal, when the differential local signal is in negative logic state, and when the positive local signal terminal is driven to a low level, and when the negative local signal terminal is driven to a high level,
wherein the third path is created by turning on the eleventh transistor to turn off the twelfth transistor and turning off the seventh transistor to enable the eighth transistor to operate with the second signal produced by the second transistor, and
wherein the fourth path is created by turning on the fifth transistor to turn off the sixth transistor and turning off the ninth transistor to enable the tenth transistor to operate with the third signal produced by the third transistor.

12. The mixer circuit according to claim 9, wherein:
(a) the first path comprises transfer characteristics expressed as:

$IFout(+)=A_{11} \times RFin(+)$ $A_{11}=(gm_{m1} \times R21) \times (gm_{m6} \times R25)$ (b) the second path comprises transfer characteristics expressed as:

$IFout(-)=A_{12} \times RFin(-)$ $A_{12}=(gm_{m4} \times R24) \times (gm_{m12} \times R26)$ (c) the third path comprises transfer characteristics expressed as:

$IFout(+)=A_{13} \times RFin(-)$ $A_{13}=(gm_{m2} \times R22) \times (gm_{m8} \times R25)$ (d) the fourth path comprises transfer characteristics expressed as:

$IFout(-)=A_{14} \times RFin(+)$ $A_{14}=(gm_{m3} \times R23) \times (gm_{m10} \times R26)$ where $A_{11}$ to $A_{14}$ represent gains of signals propagating through the first to fourth paths, respectively, each gm represents a variation of the drain current with a small change in gate voltage, RFin(+) represents a voltage level of the positive input signal at the positive input terminal, RFin(−) represents a voltage level of the negative input signal at the negative input terminal, IFout(+) represents a voltage level of an output signal at the positive output terminal, IFout(−) represents a voltage level of an output signal at the negative output terminal, R21 to R26 represent resistance of the first to sixth load resistors, and $gm_{mN}$ represent mutual conductance of the Nth transistor where N=1, 2,...12.

13. The mixer circuit according to claim 9, further comprising a level shifter circuit for shifting voltage levels of the first to fourth signals, the level shifter circuit comprising:

(a) an AC coupling section comprising:

a first capacitor placed between the first node and a gate of the sixth transistor, a second capacitor placed between the second node and a gate of the eighth transistor, a third capacitor placed between the third node and a gate of the tenth transistor, and a fourth capacitor placed between the fourth node and a gate of the twelfth transistor; and (b) a common mode feedback section that produces a divided voltage from a voltage between the positive and negative output terminals and controls a voltage signal applied to the gates of the sixth, eighth, tenth, and twelfth transistors such that the divided voltage will be equal to a specified reference voltage.

\* \* \* \* \*